(12) United States Patent
Kim et al.

(10) Patent No.: US 10,622,432 B2
(45) Date of Patent: Apr. 14, 2020

(54) DISPLAY DEVICE HAVING A CRACK BLOCKING STRUCTURE

(71) Applicant: SAMSUNG DISPLAY CO., LTD., Yongin-si, Gyeonggi-Do (KR)

(72) Inventors: Sun Ho Kim, Yongin-si (KR); Ju Chan Park, Yongin-si (KR); Young Gug Seol, Yongin-si (KR); Sun Hee Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 62 days.

(21) Appl. No.: 15/926,421

(22) Filed: Mar. 20, 2018

(65) Prior Publication Data
US 2018/0308916 A1  Oct. 25, 2018

(30) Foreign Application Priority Data

Apr. 24, 2017 (KR) .......................... 10-2017-0052408

(51) Int. Cl.
*H01L 27/32* (2006.01)
*H01L 51/50* (2006.01)
(Continued)

(52) U.S. Cl.
CPC ...... *H01L 27/3276* (2013.01); *H01L 27/3258* (2013.01); *H01L 27/3265* (2013.01); *H01L 51/5096* (2013.01); *H01L 51/56* (2013.01); *G09G 3/3233* (2013.01); *G09G 2300/0426* (2013.01); *G09G 2300/0819* (2013.01);
(Continued)

(58) Field of Classification Search
CPC ............. H01L 27/3276; H01L 27/3258; H01L 27/3262; H01L 27/3209; H01L 27/3272; H01L 51/5096
See application file for complete search history.

(56) References Cited

U.S. PATENT DOCUMENTS 6,828,584 B2 * 12/2004 Arao ................. G02F 1/136209
                                                                257/350
8,232,598 B2 *  7/2012 Yamazaki ......... H01L 21/67144
                                                                257/350
(Continued)

FOREIGN PATENT DOCUMENTS

KR        10-1155907       6/2012

*Primary Examiner* — Ida M Soward
(74) *Attorney, Agent, or Firm* — F. Chau & Associates, LLC

(57) ABSTRACT

A display device includes a substrate including a pixel region and a peripheral region. The display device also includes a plurality of pixels provided in the pixel region for displaying an image. The display device also includes a light emitting element provided in each pixel for emitting light. The display device includes a first transistor provided in each pixel for driving the light emitting element, and a second transistor connected to the first transistor. The display device includes an insulating layer disposed between a second semiconductor layer of the second transistor and the substrate; and a crack blocking layer disposed between the insulating layer and the second semiconductor layer of the second transistor. A first semiconductor layer of the first transistor and the second semiconductor layer of the second transistor are provided in layers different from each other.

16 Claims, 17 Drawing Sheets

(51) Int. Cl.
*H01L 51/56* (2006.01)
*G09G 3/3233* (2016.01)

(52) U.S. Cl.
CPC ............... *G09G 2300/0842* (2013.01); *G09G 2300/0861* (2013.01); *G09G 2310/0262* (2013.01); *H01L 27/3209* (2013.01); *H01L 27/3262* (2013.01); *H01L 27/3272* (2013.01); *H01L 2227/323* (2013.01)

(56) References Cited

U.S. PATENT DOCUMENTS

| | | | |
|---|---|---|---|
| 8,237,165 B2 | 8/2012 | Kim et al. | |
| 8,492,768 B2* | 7/2013 | Yamazaki | H01L 29/78621 |
| | | | 257/59 |
| 9,786,697 B2* | 10/2017 | Lee | H01L 27/1255 |
| 10,083,990 B2* | 9/2018 | Oh | H01L 27/3262 |
| 10,101,628 B2* | 10/2018 | Yamazaki | G02F 1/133603 |
| 10,121,899 B2* | 11/2018 | Moon | H01L 29/78606 |
| 10,147,747 B2* | 12/2018 | Toriumi | H01L 29/78696 |
| 10,263,118 B2* | 4/2019 | Yamazaki | H01L 29/7869 |
| 2009/0078939 A1* | 3/2009 | Yamazaki | H01L 21/67144 |
| | | | 257/59 |
| 2009/0127556 A1* | 5/2009 | Takayama | H01L 27/1214 |
| | | | 257/59 |
| 2015/0243724 A1* | 8/2015 | Cho | H01L 29/7869 |
| | | | 257/43 |
| 2016/0351694 A1* | 12/2016 | Hanaoka | H01L 29/78606 |
| 2018/0204896 A1* | 7/2018 | Park | H01L 27/3262 |
| 2018/0301566 A1* | 10/2018 | Ito | H01L 21/8234 |
| 2019/0006394 A1* | 1/2019 | Gupta | H01L 27/1225 |
| 2019/0121182 A1* | 4/2019 | Lius | G02F 1/13454 |

* cited by examiner

DISPLAY DEVICE HAVING A CRACK BLOCKING STRUCTURE

CROSS-REFERENCE TO RELATED APPLICATION

This application claims priority under 35 USC § 119 to Korean Patent Application No. 10-2017-0052408, filed on Apr. 24, 2017, in the Korean Intellectual Property Office, the disclosure of which is incorporated by reference herein in its entirety.

TECHNICAL FIELD

Example embodiments of the present disclosure relates to a display device and a manufacturing method of the same.

DISCUSSION OF THE RELATED ART

Foldable or rollable display devices may be manufactured using flexible materials instead of rigid substrates having no flexibility.

When a foldable or rollable display device is folded or rolled, the stress exerted on the display device may cause the display device to crack. Cracks may also be caused due to an external impact. Once started, the cracks may propagate to the interface between an insulating layer and a semiconductor layer of a transistor of the display device, and therefore, the display device may not operate properly.

SUMMARY

According to an exemplary aspect of the present disclosure, a display device includes a substrate including a pixel region and a peripheral region. The display device further includes a plurality of pixels provided in the pixel region of the substrate. The plurality of pixels displays an image. The display device further includes a light emitting element provided in each pixel. The light emitting element emits light corresponding to the image. The display device further includes a first transistor provided in each pixel. The first transistor drives the light emitting element. The display device further includes a second transistor connected to the first transistor. The display device still further includes an insulating layer disposed between a second semiconductor layer of the second transistor and the substrate. The display device further includes a crack blocking layer disposed between the insulating layer and the second semiconductor layer of the second transistor. A first semiconductor layer of the first transistor and the second semiconductor layer of the second transistor are provided in layers different from each other.

According to an exemplary embodiment of the present inventive concept, a display device includes a substrate including a pixel region and a peripheral region. The display device further includes a plurality of pixels provided in the pixel region of the substrate. The plurality of pixels displays an image. The display device still further includes a light emitting element provided in each pixel. The light emitting element emits light corresponding to the image. The display device further includes a first transistor provided in each pixel. The first transistor drives the light emitting element. The display device still further includes a second transistor connected to the first transistor. The display device further includes a crack blocking layer disposed between a second semiconductor layer of the second transistor and the substrate. The crack blocking layer includes an organic insulating material. A first semiconductor layer of the first transistor and the second semiconductor layer of the second transistor are provided in layers different from each other.

According to an exemplary embodiment of the present inventive concept, a method of manufacturing a display device includes forming a first semiconductor layer on a substrate, forming a first gate insulating layer over the first semiconductor layer, and forming a first gate lower electrode on the first gate insulating layer. The method further includes forming a second gate insulating layer over the first gate lower electrode, and forming a first gate upper electrode and a crack blocking layer on the second gate insulating layer. The method still further includes forming an insulating layer over the first gate upper electrode and the crack blocking layer, and forming a second semiconductor layer on the insulating layer. The method further includes forming, on the second semiconductor layer, a third gate insulating layer overlapping a portion of the second semiconductor layer, and forming a second gate electrode on the third gate insulating layer. The method further includes forming, on the entire surface of the substrate including the second gate electrode, an interlayer insulating layer including an opening that exposes a portion of each of the first and second semiconductor layers. The method further includes forming, on the interlayer insulating layer, first source and drain electrodes each connected to the first semiconductor layer, and second source and drain electrodes each connected to the second semiconductor layer, and forming a light emitting element connected to the first drain electrode to emit light. The first semiconductor layer and the second semiconductor layer include materials different from each other.

BRIEF DESCRIPTION OF THE DRAWINGS

The above and other features of the inventive concept will become more apparent by describing in detail exemplary embodiments thereof, with reference to the accompanying drawing, which.

DETAILED DESCRIPTION OF THE EMBODIMENTS

Figure 1:
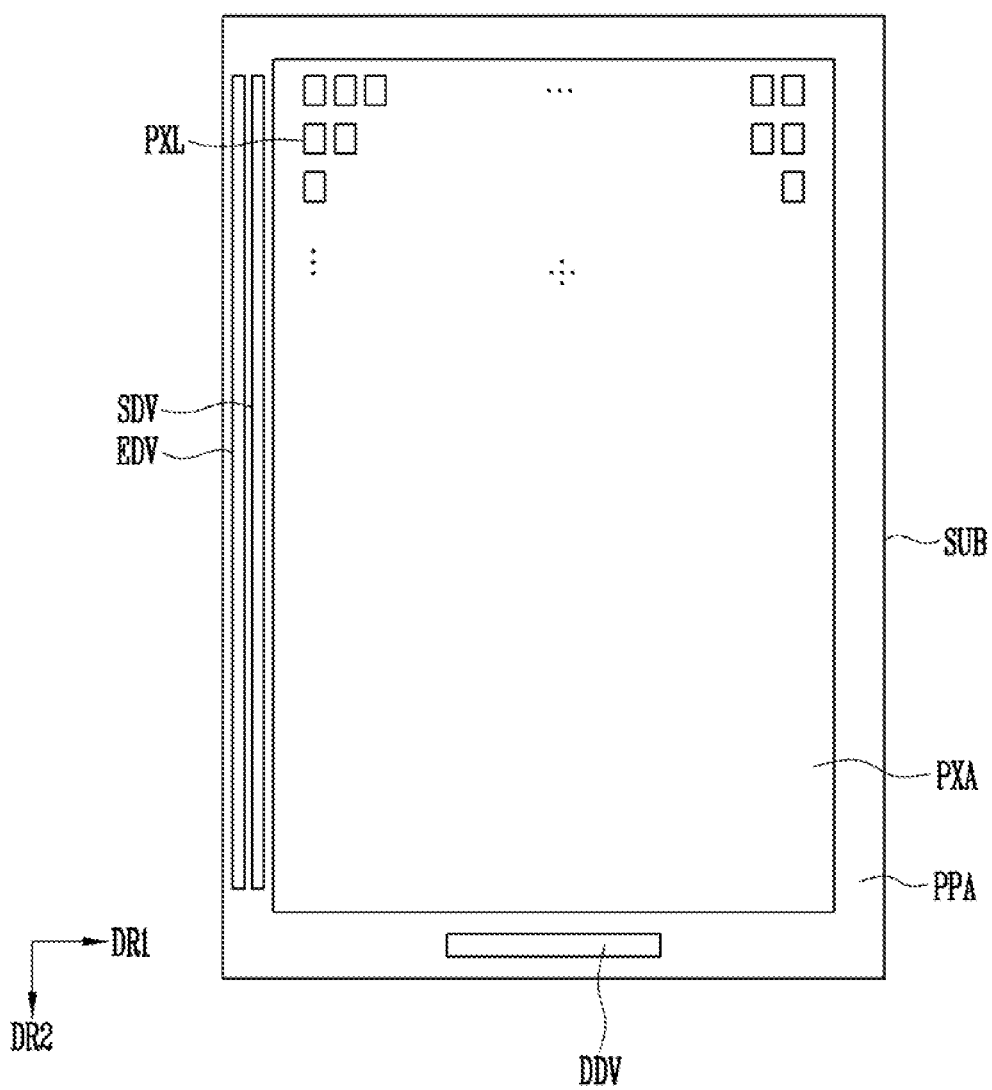
FIG. 1 is a plan view illustrating a display device according to an exemplary embodiment of the present inventive concept.

Exemplary embodiments of the present inventive concept will be described more fully hereafter with reference to the accompanying drawings. The present disclosure may, however, be embodied in many different forms and should not be construed as limited to the embodiments set forth herein.

It will be understood that when an element or layer is referred to as being "on" or "connected to" another element or layer, it may be directly on, or connected to the other element or layer or intervening elements or layers may be present. Like reference numerals refer to like elements throughout the specification and drawings.

FIG. 1 is a plan view illustrating a display device according to an exemplary embodiment of the present inventive concept.

Referring to FIG. 1, the display device according to an exemplary embodiment of the present disclosure may include a substrate SUB, pixels PXL provided on the substrate SUB, a driving unit provided on the substrate SUB for driving the pixels PXL, and a line unit (not shown) connecting the pixels PXL and the driving unit.

The substrate SUB may include a pixel region PXA and a peripheral region PPA. The pixel region PXA may be a region in which the pixels PXL that display an image are provided. Each pixel PXL will be described later. The peripheral region PPA is a region in which the pixels PXL are not provided, and may be a region in which any image is not displayed. The driving unit for driving the pixels PXL and some of lines (not shown) connecting the pixels PXL and the driving unit may be provided in the peripheral region PPA. The peripheral region PPA may correspond to a bezel in a final display device, and the width of the bezel may be determined according to the width of the peripheral region PPA.

The pixel region PXA may have various shapes. For example, the pixel region PXA may be provided in various shapes such as a closed polygon including sides; a circle; an ellipse or the like including curved sides; and a semicircle or a semi-ellipse or the like including one or more linear and curved sides. In an embodiment of the present disclosure, an embodiment where the pixel region PXA is provided as one region having a quadrangular shape including linear sides may be described as an example.

The peripheral region PPA may be provided in at least one side of the pixel region PXA of the substrate SUB. In an embodiment of the present inventive concept, the peripheral region PPA may surround the circumference of the pixel region PXA. The peripheral region PPA may include a lateral part extending in a first direction DR1 and a longitudinal part extending in a second direction DR2 intersecting the first direction DR1. The longitudinal part of the peripheral region PPA may be provided in a pair spaced apart from each other along the width direction of the pixel region PXA.

The pixels PXL may be provided in the pixel region PXA on the substrate SUB. Each of the pixels PXL may be a minimum unit for displaying an image, and multiple pixels PXL may be provided. Each of the pixels PXL may include a display element that emits white light and/or colored light.

The pixel PXL may be provided in plurality to be arranged in a matrix form along rows extending in the first direction DR1 as a row direction, and columns extending in the second direction DR2 as a column direction. In one embodiment, the first direction DR1 may be perpendicular to the second direction DR2. However, the arrangement form of the pixels PXL is not limited thereto, and the pixels PXL may be arranged in various forms. For example, some of the pixels PXL may be arranged such that the first direction DR1 corresponds to the row direction, but other pixels PXL may be arranged in a direction different from the first direction DR1. In one example, a direction oblique to the first direction DR1 may be the row direction. Alternatively, the pixels PXL may be arranged such that a direction inclined to the first direction DR1 and the second direction DR2 may be the column direction and such that a direction intersecting the column direction may be the row direction. Here, the column direction may also be inclined to the first direction DR1 and the second direction DR2.

The driving unit may include a scan driver SDV that provides a scan signal to each pixel PXL through a scan line (not shown), an emission driver EDV that provides an emission control signal to each pixel PXL through an emission control line (not shown), a data driver DDV that provides a data signal to each pixel PXL through a data line (not shown), and a timing controller (not shown). The timing controller may control the scan driver SDV, the emission driver EDV, and the data driver DDV.

The scan driver SDV may be disposed at at least one of the longitudinal parts of the peripheral region PPA. The scan driver SDV may extend along the column direction of the peripheral region PPA, but the present disclosure is not limited thereto.

In an embodiment of the present inventive concept, the scan driver SDV may be directly mounted on the substrate SUB. When the scan driver SDV is directly mounted on the substrate SUB, the scan driver SDV may be formed together with the pixels PXL in a process of forming the pixels PXL. However, the mounting position and forming method of the scan driver SDV are not limited thereto. For example, the scan driver SDV may be formed on a separate chip to be provided in a chip-on-glass form on the substrate SUB. Alternatively, the scan driver SDV may be mounted on a printed circuit board to be connected to the substrate SUB through a connecting member.

The emission driver EDV may be disposed at at least one of the longitudinal parts of the peripheral region PPA. The emission driver EDV may extend along the column direction of the peripheral region PPA.

In an embodiment of the present inventive concept, the scan driver SDV and the emission driver EDV may be adjacent to each other, and disposed only at one of the pair of longitudinal parts of the peripheral region PPA as illustrated as an example in FIG. 1. However, the present disclosure is not limited thereto, and the arrangement of the scan driver SDV and the emission driver EDV may be modified in various manners.

The data driver DDV may be disposed at the peripheral region PPA. For example, the data driver DDV may be disposed at the lateral part of the peripheral region PPA. The data driver DDV may extend along the width direction of the peripheral region PPA.

Figure 2:
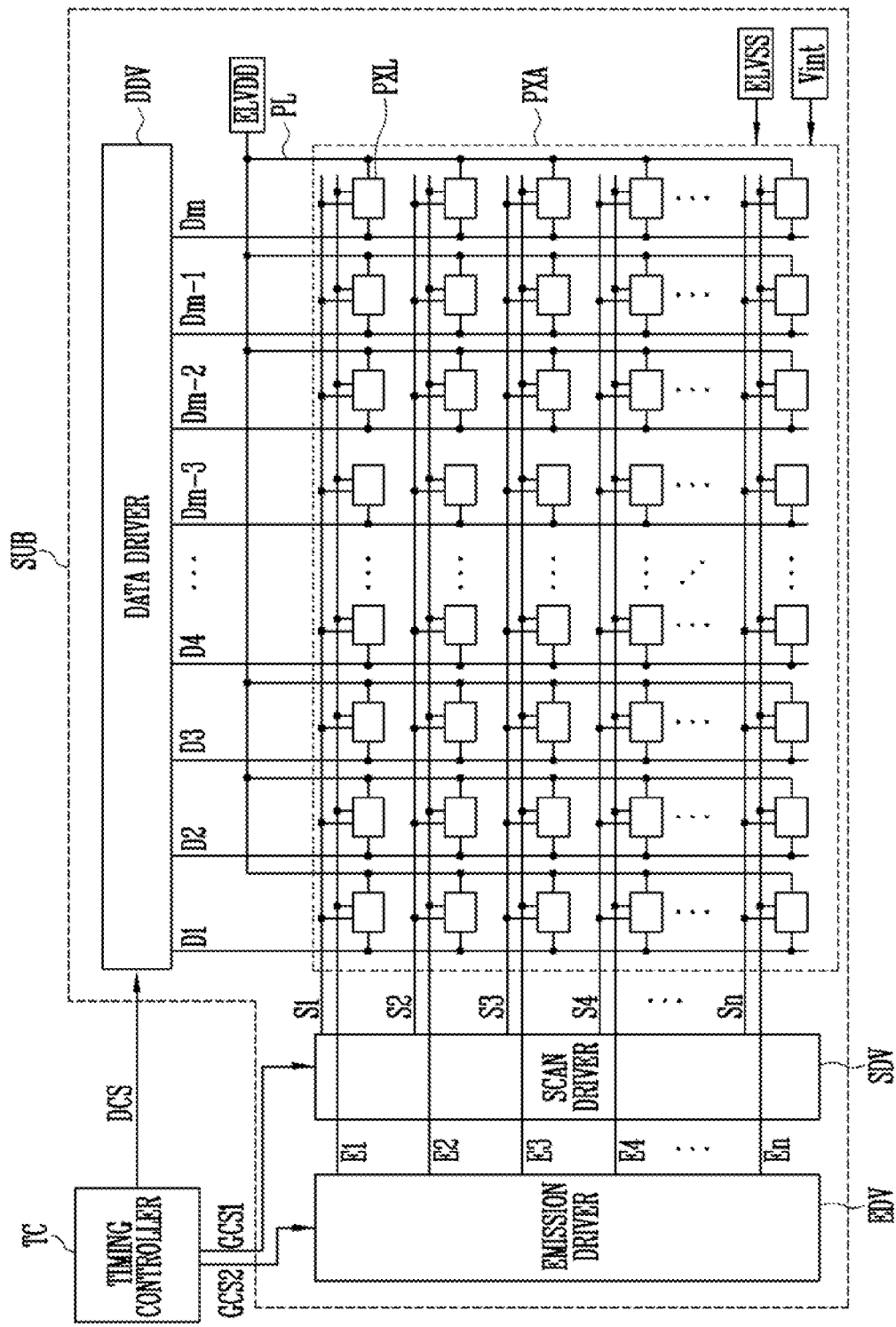
FIG. 2 is a block diagram illustrating an exemplary embodiment of pixels and a driving unit in the display device of FIG. 1 according to an exemplary embodiment of the present inventive concept.

FIG. 2 is a block diagram illustrating an embodiment of the pixels and the driving unit in the display device of FIG. 1.

Referring to FIGS. 1 and 2, the display device according to the embodiment of the present inventive concept may include pixels (PXL), the driving unit, and the line unit.

The pixel PXL may be provided in multiple numbers. Each pixel PXL may be a minimum unit for displaying an image, and the multiple numbers of pixels PXL may include the display element that emits light. For example, the display element may be any one of a liquid crystal display (LCD) element, an electrophoretic display (EPD) element, an electrowetting display (EWD) element, and an organic light emitting display (OLED) element. Meanwhile, for convenience of description, a case where an OLED element is used as the display element is described as an example.

Each pixel PXL may emit light of one of red, green, and blue, but the present disclosure is not limited thereto. For example, each pixel PXL may emit light of a color such as cyan, magenta, or yellow.

The driving unit may include the scan driver SDV, the emission driver EDV, the data driver DDV, and the timing controller TC. In FIG. 2, positions of the scan driver SDV, the emission driver EDV, the data driver DDV, and the timing controller TC may be set for convenience of description. When an operation of an actual display device is implemented, the scan driver SDV, the emission driver EDV, the data driver DDV, and the timing controller TC may be disposed at other positions in the display device.

The line unit may provide signals to each pixel PXL from the driving unit, and may include scan lines S1 to Sn, data lines D1 to Dm, emission control lines E1 to En, a power line PL, and an initialization power line (not shown).

The pixels PXL may be arranged in the pixel region PXA. The pixels PXL may be connected to the scan lines S1 to Sn, the emission control lines E1 to En, the data lines D1 to Dm, and the power line PL. The pixels PXL may be supplied with the data signal from the data lines D1 to Dm, when a scan signal is supplied from the scan lines S1 to Sn.

The pixels PXL may be supplied with power from a first power source ELVDD, a second power source ELVSS, and an initialization power source Vint from the outside. For example, the power from the first power source ELVDD may be applied to the pixels PXL through the power line PL.

Each of the pixels PXL may include a driving transistor (not shown) and a display element (not shown). The driving transistor may control the amount of current flowing from the first power source ELVDD to the second power source ELVSS via the display element, in response to the data signal. In one embodiment, before the data signal is supplied, a gate electrode of the driving transistor may be initialized by the voltage of the initialization power source Vint. To this end, the voltage of the initialization power source Vint may be set to a lower voltage than that of the data signal.

The scan driver SDV may supply the scan signal to the scan lines S1 to Sn in response to a first gate control signal GCS1 from the timing controller TC. For example, the scan driver SDV may sequentially supply the scan signal to the scan lines S1 to Sn. If the scan signal is sequentially supplied to the scan lines S1 to Sn, the pixels PXL may be sequentially selected in the units of horizontal lines.

The emission driver EDV may supply the emission control signal to the emission control lines E1 to En in response to a second gate control signal GCS2 from the timing controller TC. For example, the emission driver EDV may sequentially supply the emission control signal to the emission control lines E1 to En. Here, a width of the emission control signal may be set to be wider than that of the scan signal.

The data driver DDV may supply the data signal to the data lines D1 to Dm in response to a data control signal DCS. The data signal supplied to the data lines, D1 to Dm, may be supplied to pixels PXL selected by the scan signal.

The timing controller TC may supply the first gate control signal GCS1 to the scan drivers SDV. The first gate control signal GCS1 may be generated based on the timing signals supplied from the outside. The second gate control signal GCS2 may be supplied to the emission driver EDV, and the data control signal DCS may be supplied to the data driver.

A start pulse and clock signals may be included in each of the gate control signals GCS1 and GCS2. The start pulse may control a timing of a first scan signal or a first light emitting control signal. The clock signals may be used to shift the start pulse.

A source start pulse and clock signals may be included in the data control signal DCS. The source start pulse may control a start time of data sampling. The clock signals may be used to control a sampling operation.

Figure 3A:
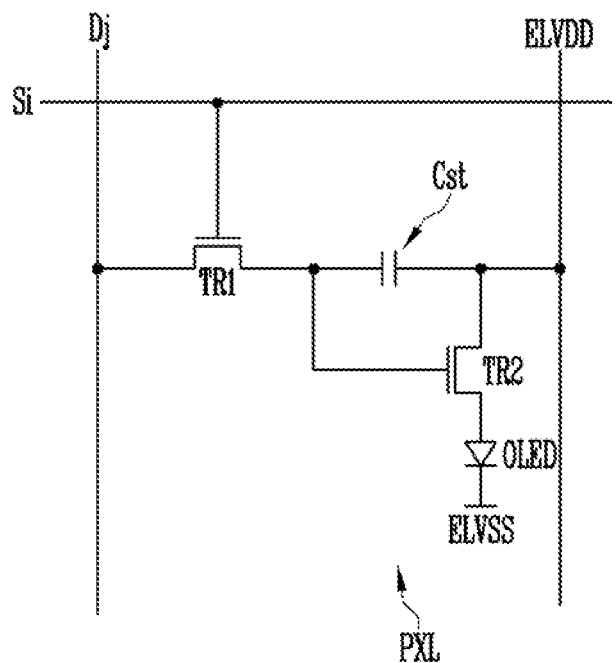
FIGS. 3A and 3B are equivalent circuit diagrams illustrating an exemplary embodiment where a pixel shown in FIG. 1 is a light emitting device according to an exemplary embodiment of the present inventive concept.
Figure 3B:
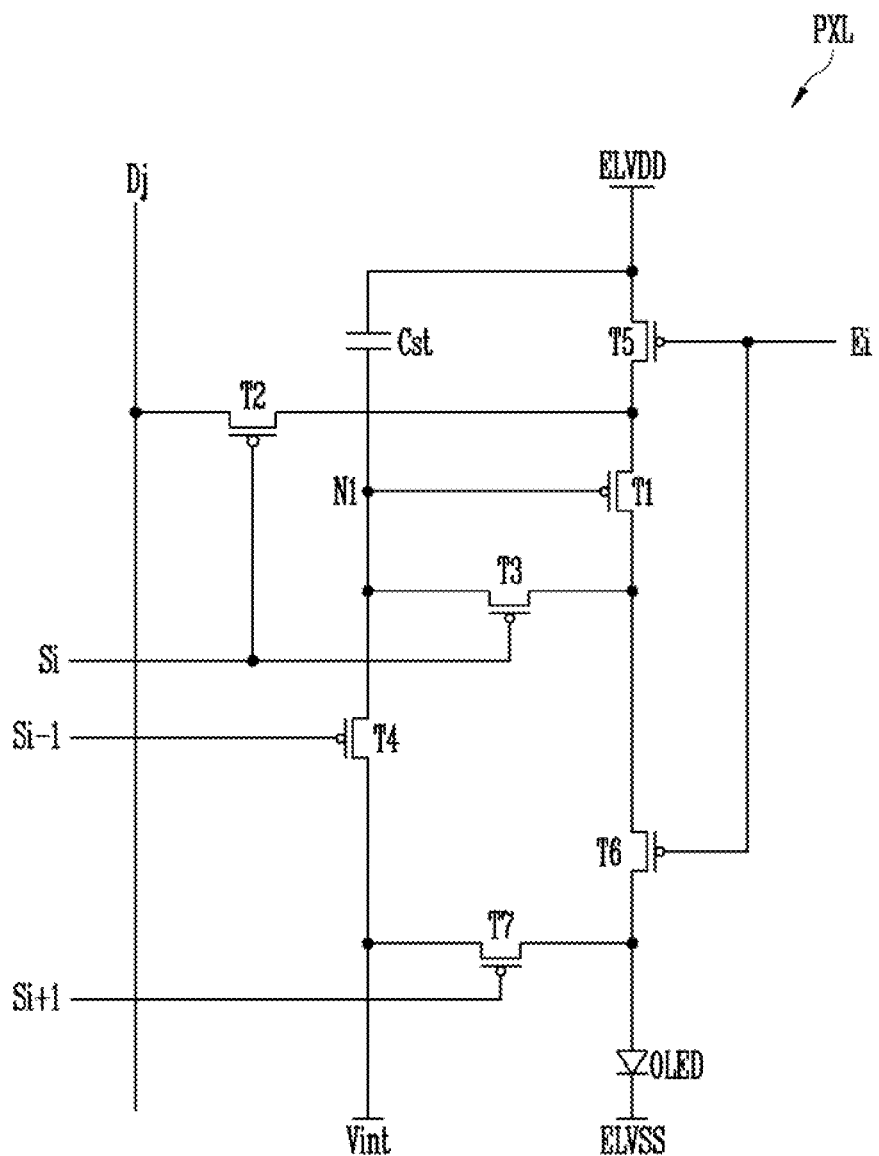

FIGS. 3A and 3B are equivalent circuit diagrams illustrating an embodiment where the pixel shown in FIG. 1 is a light emitting device.

Referring to FIGS. 1 and 3A, each pixel PXL may include a pixel circuit unit connected to a line unit, and a light emitting element OLED connected to the pixel circuit unit.

The pixel circuit unit may include the driving transistor TR2 for controlling the light emitting element OLED, a switching transistor TR1 for switching the driving transistor TR2, and a capacitor Cst connected to first and second power sources ELVDD and ELVSS in the line unit.

The switching transistor TR1 may include a gate electrode, a source electrode, and a drain electrode. In the switching transistor TR1, the gate electrode may be connected to an ith scan line Si, and the source electrode may be connected to a jth data line Dj. The drain electrode may be connected to a gate electrode of the driving transistor TR2. The switching transistor TR1 may transmit a data signal applied to the jth data line Dj to the driving transistor TR2 in response to the scan signal applied to the ith scan line Si.

The driving transistor TR2 may include the gate electrode, the source electrode, and the drain electrode. In the driving transistor TR2, the gate electrode may be connected to the switching transistor TR1, the source electrode may be connected to the first power line ELVDD, and the drain electrode may be connected to the light emitting element OLED.

The light emitting element OLED may include an emitting layer, and an anode electrode and a cathode electrode, which are positioned opposite to each other with the emitting layer interposed therebetween. The anode electrode may be connected to the drain electrode of the driving transistor TR2. The cathode electrode may be connected to the second power source ELVSS such that a common voltage is applied thereto. As the emitting layer emits light in response to an output signal of the driving transistor TR2, the light emitting element OLED emits or does not emit light, thereby displaying an image. In one embodiment, the nature of light emitted from the emitting layer may vary depending on the material of the emitting layer, and may be colored light or white light.

The capacitor Cst may be connected between the gate electrode and the source electrode of the driving transistor TR2, and may charge and maintain the data signal input to the gate electrode of the driving transistor TR2.

In an exemplary embodiment of the present inventive concept, it is illustrated that the pixel circuit unit includes two transistors TR1 and TR2. However, the present disclosure is not limited thereto, and the pixel circuit unit may include one thin film transistor and a capacitor, or three or more transistors and two or more capacitors in other embodiments. For example, as shown in FIG. 3B, the pixel circuit unit may include first to seventh transistor T1 to T7 and a capacitor Cst. When the pixel circuit unit includes the first to seventh transistors T1 to T7 and the capacitor Cst, the connection relationship of components included in each pixel PXL may be as follows.

Referring to FIG. 3B, each pixel PXL may include the pixel circuit unit including the first to seventh transistors T1 to T7 and the light emitting element OLED connected to the pixel circuit unit.

The anode electrode of the light emitting element OLED may be connected to the first transistor T1 via the sixth transistor T6, and the cathode electrode of the light emitting element OLED may be connected to the second power source ELVSS. The light emitting element OLED may generate light with a predetermined luminance corresponding to the amount of current supplied from the first transistor T1.

A level of power provided to the first power source ELVDD may be set to be higher than that of a second power provided to the second power source ELVSS such that current can flow through the light emitting element OLED.

The seventh transistor T7 may be connected between the initialization power source Vint and the anode electrode of the light emitting element OLED. In addition, a gate electrode of the seventh transistor T7 may be connected to an (i+1)th scan line Si+1. The seventh transistor T7 may be turned on when the scan signal is supplied to the (i+1)th scan line Si+1, and the seventh transistor T7 may supply an initialization power provided from the initialization power source Vint to the anode electrode of the light emitting element OLED. In one example, the voltage level of the initialization power may be set to be lower than that of the data signal provided to the jth data line Dj.

The sixth transistor T6 may be connected between the first transistor T1 and the light emitting element OLED. In addition, a gate electrode of the sixth transistor T6 may be connected to an ith emission control line Ei. The sixth transistor T6 may be turned off when the emission control signal is supplied to the ith emission control line Ei, and may be turned on otherwise.

The fifth transistor T5 may be connected between the first power source ELVDD and the first transistor T1. In addition, a gate electrode of the fifth transistor T5 may be connected to the ith emission control line Ei. The fifth transistor T5 may be turned off when the emission control signal is supplied to the ith emission control line Ei, and be turned on otherwise.

A first electrode of the first transistor (driving transistor) T1 may be connected to the first power source ELVDD via the fifth transistor T5, and a second electrode of the first transistor T1 may be connected to the anode electrode of the light emitting element OLED via the sixth transistor T6. In addition, a gate electrode of the first transistor T1 may be connected to a first node N1. The first transistor T1 may respond to a voltage of the first node N1, and control the amount of current flowing the first power source ELVDD to the second power source ELVSS via the light emitting element OLED.

The third transistor T3 may be connected between the second electrode of the first transistor T1 and the first node N1. In addition, a gate electrode of the third transistor T3 may be connected to the ith scan line Si. The third transistor T3 may be turned on when the scan signal is supplied to the ith scan line Si, to allow the second electrode of the first transistor T1 and the first node N1 to electrically connect to each other. Therefore, when the third transistor T3 is turned on, the first transistor T1 may be connected in the form of a diode.

The fourth transistor T4 may be connected between the first node N1 and the initialization power source Vint. In addition, a gate electrode of the fourth transistor T4 may be connected to an (i−1)th scan line Si−1. The fourth transistor T4 may be turned on when the scan signal is supplied to the (i−1)th scan line Si−1, to supply the initialization power to the first node N1.

The second transistor T2 may be connected between the jth data line Dj and the first electrode of the first transistor T1. In addition, a gate electrode of the second transistor T2 may be connected to the ith scan line Si. The second transistor T2 may be turned on when the scan signal is supplied to the ith scan line Si, to allow the jth data line Dj and the first electrode of the first transistor T1 to electrically connect to each other.

The capacitor Cst may be connected between the first power source ELVDD and the first node N1. The capacitor Cst may store a voltage corresponding to the data signal and a threshold voltage of the first transistor T1.

Figure 4:
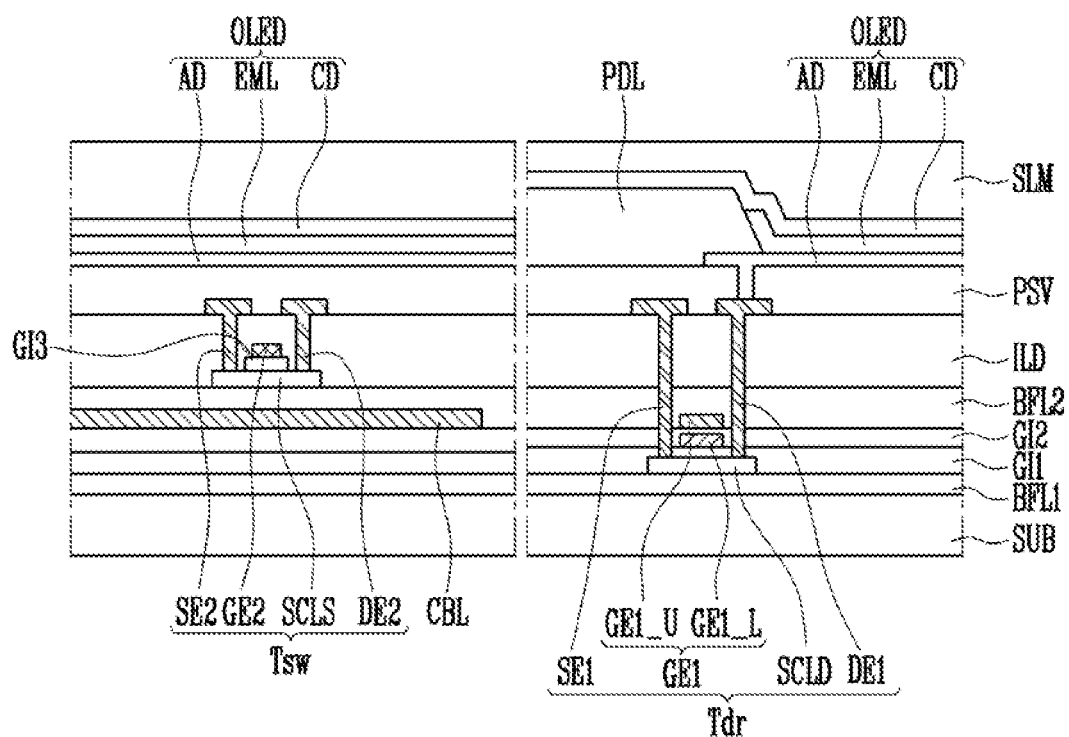
FIG. 4 is a sectional view illustrating a portion of a display device according to an exemplary embodiment of the present inventive concept.

FIG. 4 is a sectional view illustrating a portion of a display device according to an exemplary embodiment of the present inventive concept. For convenience of description, first and second transistors provided in each pixel and the light emitting device connected to the transistors are mainly illustrated in FIG. 4.

Referring to FIG. 4, the display device according to an exemplary embodiment of the present inventive concept may include the substrate SUB, first and second transistors Tdr and Tsw provided on the substrate SUB, and the light emitting element OLED.

The substrate SUB may be made of an insulative material, for example, glass or resin. Also, the substrate SUB may be made of a material having flexibility to be bendable or foldable. In one embodiment, the substrate SUB may have a single- or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the substrate SUB may include one or more materials other than the materials explained above. For example, the substrate SUB may be made of fiber glass reinforced plastic FRP, or the like. In an embodiment of the present inventive concept, the substrate SUB may include one or more materials having flexibility.

A first buffer layer BFL1 may be disposed between the substrate SUB and the first and second transistors Tdr and Tsw. The first buffer layer BFL1 may have a single- or multi-layered structure. The first buffer layer BFL1 may include any one of an inorganic insulating material or an organic insulating material. In an embodiment of the present inventive concept, the first buffer layer BFL1 may include the inorganic insulating material that may be brittle as compared with the organic insulating material. For example, the first buffer layer BFL1 may include silicon nitride, silicon oxide, silicon oxynitride, or the like. When the first buffer layer BFL1 is provided in the multi-layer including a plurality of layers, the layers may be formed of the same material or be formed of different materials.

The first transistor Tdr may be the driving transistor that is connected to the light emitting element OLED to drive the light emitting element OLED. The second transistor Tsw may be the switching transistor for switching the first transistor Tdr. For example, the first transistor Tdr may be the driving transistor TR2 shown in FIG. 3A, and the second transistor Tsw may be the switching transistor TR1 shown in FIG. 3A. In addition, the first transistor Tdr may be the first transistor T1 shown in FIG. 3B, and the second transistor Tsw may be the second transistor T2 shown in FIG. 3B.

The first transistor Tdr may include a first semiconductor layer SCLD, a first gate electrode GE1, a first source electrode SE1, and a first drain electrode DE1.

The first semiconductor layer SCLD may be disposed on the first buffer layer BFL1. The first semiconductor layer SCLD may include a source region and a drain region, which are respectively in contact with the first source electrode SE1 and the first drain electrode DE1. A region between the source region and the drain region may be a channel region. The first semiconductor layer SCLD may include any one of amorphous silicon, polycrystalline silicon and single-crystalline silicon.

The first gate electrode GE1 may include a first gate lower electrode GE1_L disposed on the first semiconductor layer SCLD with a first gate insulating layer GI1 interposed therebetween, and a first gate upper electrode GE1_U disposed on the first gate lower electrode GE1_L with a second gate insulating layer GI2 interposed therebetween. The first gate lower electrode GE1_L and the first gate upper electrode GE1_U may overlap with each other with the second gate insulating layer GI2 interposed therebetween.

The first source electrode SE1 and the first drain electrode DE1 may be connected to the source region and the drain region of the first semiconductor layer SCLD through contact holes sequentially passing through an interlayer insulating layer ILD, a second buffer layer BFL2, the second gate insulating layer GI2, and the first gate insulating layer GI1, respectively. The first source electrode SE1 and the first drain electrode DE1 may be disposed to be spaced apart from each other.

The second transistor Tsw may be disposed on the second buffer layer BFL2 of the substrate SUB. The second transistor Tsw may include a second semiconductor layer SCLS, a second gate electrode GE2, a second source electrode SE2, and a second drain electrode DE2.

The second semiconductor layer SCLS may be disposed on the second buffer layer BFL2. The second semiconductor layer SCLS may include an oxide semiconductor. The oxide semiconductor may include at least one of one-component metal oxide, for example, indium (In) oxide, tin (Sn) oxide, or zinc (Zn) oxide, two-component metal oxide, for example, In—Zn-based oxide, Sn—Zn-based oxide, Al—Zn-based oxide, Zn—Mg-based oxide, Sn—Mg-based oxide, In—Mg-based oxide, or In—Ga-based oxide, three-component metal oxide, for example, In—Ga—Zn-based oxide, In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide, and four-component metal oxide, for example, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, or In—Hf—Al—Zn-based oxide. For example, the second semiconductor layer SCLS may include indium-gallium-zinc oxide in the In—Ga—Zn-based oxide.

In addition, the second semiconductor layer SCLS may include the source region and the drain region, which may be respectively in contact with the second source electrode SE2 and the second drain electrode DE2. A region between the source region and the drain region may be the channel region.

The second gate electrode GE2 may be disposed on the second semiconductor layer SCLS with a third gate insulating layer GI3 interposed therebetween.

The second source electrode SE2 and the second drain electrode DE2 may be connected to the source region and the drain region of the second semiconductor layer SCLS through contact holes passing through the interlayer insulating layer ILD, respectively. The second source electrode SE2 and the second drain electrode DE2 may be disposed to be spaced apart from each other.

The light emitting element OLED may be disposed on the first and second transistors Tdr and Tsw. The light emitting element OLED may include first and second electrodes AD and CD, and an emitting layer EML disposed between the two electrodes AD and CD. Here, any one of the first and second electrodes AD and CD may be an anode electrode, and the other of the first and second electrodes AD and CD may be a cathode electrode. For example, the first electrode AD may be an anode electrode and the second electrode CD may be a cathode electrode. When the light emitting element OLED is a top-emission organic light emitting element, the first electrode AD may be a reflective electrode, and the second electrode CD may be a transmissive electrode. In an embodiment of the present inventive concept, an embodiment where the light emitting element OLED is a top-emission organic light emitting element and the first electrode AD is an anode electrode is described as an example.

The first electrode AD may be connected to the first drain electrode DE1 of the first transistor Tdr through a contact hole passing through a passivation layer PSV. The emitting layer EML may be disposed on the first electrode AD of which surface may be exposed by a pixel defining layer PDL, and may emit colored light and/or white light. The second electrode CD may be disposed on the emitting layer EML.

Meanwhile, a crack blocking layer CBL may be disposed between the substrate SUB and the second transistor Tsw.

The crack blocking layer CBL may be disposed on the second gate insulating layer GI2. The crack blocking layer CBL may serve as a barrier when one or more cracks are generated in the first buffer layer BFL1 and the first and second gate insulating layers GI1 and GI2, which are disposed on the bottom of the crack blocking layer CBL, thereby blocking the propagation of the cracks. Thus, the cracks may be blocked from propagating to the second transistor Tsw.

The crack blocking layer CBL may be disposed only in a region in which the second transistor Tsw is provided on the substrate SUB to overlap with the second semiconductor layer SCLS of the second transistor Tsw. The crack blocking layer CBL may be provided in the same layer as the first gate upper electrode GE1_U of the first transistor Tdr, and may include the same material as the first gate upper electrode GE1_U of the first transistor Tdr. In one example, the crack blocking layer CBL and the firs gate upper electrode GE1_U may include a conductive material. In another example, the conductive material may include a ductile metal in which no crack is generated even in a region in which the maximum elasticity deformation occurs, and only plasticity deformation occurs. In an embodiment of the present inventive concept, the ductile metal may include titanium (Ti), copper (Cu), aluminum (Al), and any alloy thereof, but the present inventive concept is not limited thereto. Also, in an embodiment of the present inventive concept, the crack blocking layer CBL may be formed in the single layer or the multi-layer. For example, the multi-layer may include a double layer, for example, TiNx/Al, TiNx/Al-alloy, Ti/Cu, and the like or a triple layer including Ti/TiNx/Al, Ti/TiNx/Al-alloy, and the like. In an embodiment of the present inventive concept, the crack blocking layer CBL may have a thickness of about 1,000 Å to about 10,000 Å.

Meanwhile, the display device may include a capacitor (not shown) connected between the first gate electrode GE1 and the first source electrode SE1 of the first transistor Tdr. The capacitor may charge and maintain a data signal input to the first gate electrode GE1 of the first transistor Tdr. The capacitor may include a first capacitor electrode (not shown) provided in the same layer as the first gate lower electrode GE1_L and a second capacitor electrode (not shown) provided in the same layer as the first gate upper electrode GE1_U.

Hereinafter, a structure of the display device according to the embodiment of the present inventive concept will be described along a stacking order with reference back to FIG. 4.

The first buffer layer BFL1 may be disposed on the substrate SUB. The first buffer layer BFL1 may prevent impurities from being diffused into the first transistor Tdr. The first buffer layer BFL1 may be an inorganic insulating layer made of an inorganic material. For example, the first buffer layer BFL1 may be formed of silicon nitride, silicon oxide, silicon oxynitride, or the like. When the first buffer layer BFL1 is formed in the multi-layer including a plurality of layers, the layers may be formed of the same material or may be formed of different materials. In an embodiment of the present inventive concept, the first buffer layer BFL1 may further include the barrier layer that protects the substrate SUB.

The first semiconductor layer SCLD may be disposed on the first buffer layer BFL1. The first semiconductor layer SCLD may include a semiconductor pattern made of amorphous silicon, polycrystalline silicon, single-crystalline silicon, or the like.

The first gate insulating layer GI1 may be provided over the first semiconductor layer SCLD. The first gate insulating layer GI1 may be the inorganic insulating layer including the inorganic material. For example, the first gate insulating layer GI1 may include silicon nitride, silicon oxide, silicon oxynitride, and the like.

The first gate lower electrode GE1_L may be disposed on the first gate insulating layer GI1. The first gate lower electrode GE1_L may be made of at least one of metals, for example, gold (Au), silver (Ag), aluminum (Al), molybdenum (Mo), chromium (Cr), titanium (Ti), nickel (Ni), neodymium (Nd), and copper (Cu), or alloys of the metals. The first gate lower electrode GE1_L may be formed in a single layer. However, the present disclosure is not limited thereto, and the first gate lower electrode GE1_L may be formed in the multi-layer in which two or more materials among the metals and the alloys may be stacked.

The second gate insulating layer GI2 may be provided over the first gate lower electrode GE1_L. The second gate insulating layer GI2 may be the inorganic insulating layer including the inorganic material. For example, the second gate insulating layer GI2 may include silicon nitride, silicon oxide, silicon oxynitride, and the like. Also, the second gate insulating layer GI2 may include the same material as the first gate insulating layer GI1.

The first gate upper electrode GE1_U and the crack blocking layer CBL may be disposed on the second gate insulating layer GI2. The first gate upper electrode GE1_U and the crack blocking layer CBL may be provided in the same layer, and may include the same material. In an embodiment of the present disclosure, the first gate upper electrode GE1_U and the crack blocking layer CBL may be made of a conductive material including the ductile metal.

The second buffer layer BFL2 may be disposed on the substrate SUB on which the first gate upper electrode GE1_U and the crack blocking layer CBL are provided. The second buffer layer BFL2 may be the inorganic insulating layer made of the inorganic material or an organic insulating layer made of an organic material.

The second semiconductor layer SCLS may be disposed on the second buffer layer BFL2. The second semiconductor layer SCLS may include the oxide semiconductor.

The third gate insulating layer GI3 may be provided over the second semiconductor layer SCLS. The third gate insulating layer GI3 may be the inorganic insulating layer made of the inorganic material. For example, the third gate insulating layer GI3 may include silicon nitride, silicon oxide, silicon oxynitride, and the like. Here, the third gate insulating layer GI3 may be patterned to overlap with a partial region, for example, the channel region, of the second semiconductor layer SCLS.

The second gate electrode GE2 may be disposed on the third gate insulating layer GI3. The second gate electrode GE2 may be made of at least one of metals, for example, gold (Au), silver (Ag), aluminum (Al), molybdenum (Mo), chromium (Cr), titanium (Ti), nickel (Ni), neodymium (Nd), and copper (Cu), or alloys of the metals. Also, the second gate electrode GE2 may be formed in the single layer. However, the present disclosure is not limited thereto, and the second gate electrode GE2 may be formed in the multi-layer in which two or more materials among the metals and the alloys are stacked.

The interlayer insulating layer ILD may be disposed on the substrate SUB on which the second gate electrode GE2 is provided. The interlayer insulating layer ILD may be the inorganic insulating layer made of the inorganic material, or the organic insulating layer made of the organic material. In an embodiment of the present inventive concept, the interlayer insulating layer ILD may be the organic insulating layer.

The first and second source electrodes SE1 and SE2 and the first and second drain electrodes DE1 and DE2 may be disposed on the interlayer insulating layer ILD. Each of the first and second source electrodes SE1 and SE2 and the first and second drain electrodes DE1 and DE2 may be made of at least one of metals, for example, gold (Au), silver (Ag), aluminum (Al), molybdenum (Mo), chromium (Cr), titanium (Ti), nickel (Ni), neodymium (Nd), and copper (Cu), or alloys of the metals. Also, each of the first and second source electrodes SE1 and SE2 and the first and second drain electrodes DE1 and DE2 may be formed in the single layer. However, the present disclosure is not limited thereto, and each of the first and second source electrodes SE1 and SE2 and the first and second drain electrodes DE1 and DE2 may be formed in the multi-layer in which two or more materials among the metals and the alloys are stacked.

The first source electrode SE1 may be in contact with the source region of the first semiconductor layer SCLD through a contact hole passing through the first and second gate insulating layers GI1 and GI2, the second buffer layer BFL2, and the interlayer insulating layer ILD. The first drain electrode DE1 may be in contact with the drain region of the first semiconductor layer SCLD through a contact passing through the first and second gate insulating layers GI1 and GI2, the second buffer layer BFL2, and the interlayer insulating layer ILD.

The second source electrode SE2 may be in contact with the source region of the second semiconductor layer SCLS through a contact hole passing through the interlayer insulating layer ILD. The second drain electrode DE2 may be in contact with the drain electrode of the second semiconductor layer SCLS through a contact hole passing through the interlayer insulating layer ILD.

The passivation layer PSV may be provided over the first and second transistors Tdr and Tsw.

The passivation layer PSV may include at least one layer. For example, the passivation layer PSV may include at least one of an inorganic passivation layer or an organic passivation layer. For example, the passivation layer PSV may include the inorganic passivation layer that covers the first and second transistors Tdr and Tsw and the organic passivation layer disposed on the inorganic passivation layer.

The inorganic passivation layer may include at least one of silicon oxide and silicon nitride. The organic passivation layer may include the organic insulating material that may enable light to be transmitted therethrough. For example, the organic passivation layer may include at least one of polyacrylate resin, epoxy resin, phenolic resin, polyamide resin, polyimide resin, unsaturated polyester resin, polyphenylene ether resin, polyphenylene sulfide resin, and benzocyclobutene resin.

The first electrode AD may be disposed on the passivation layer PSV. The first electrode AD may be connected to the first drain electrode DE1 through a contact hole passing through the passivation layer PSV. The first electrode AD may include a reflective layer (not shown) capable of reflecting light and a transparent conductive layer (not shown) disposed on the top or bottom of the reflective layer. At least one of the transparent conductive layer and the reflective layer may be connected to the first drain electrode DE1.

The reflective layer may include a material capable of reflecting light. For example, the reflective layer may include at least one of aluminum (Al), silver (Ag), chromium (Cr), molybdenum (Mo), platinum (Pt), nickel (Ni), and alloys thereof. The transparent conductive layer may include a transparent conductive oxide. For example, the transparent conductive layer may include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL that may expose a portion of the first electrode AD, for example, a top surface of the first electrode AD, may be disposed on the passivation layer PSV on which the first electrode AD is disposed.

The pixel defining layer PDL may include the organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be disposed on the exposed surface of the first electrode AD.

The emitting layer EML may include a low-molecular or high-molecular material. In an embodiment of the present disclosure, the low-molecular material may include copper phthalocyanine (CuPc), N,N'-Di(naphthalene-1-yl)-N,N'-diphenyl-benzidine (NPB), tris-8-hydroxyquinoline aluminum ($Alq_3$), and the like. The high-molecular material may include poly(3,4-ethylenedioxythiophene) (PEDOT)-, poly(phenylene-vinylene) (PPV)-, poly(fluorine)-based materials.

The emitting layer EML may be provided as the single layer, but may be provided as the multi-layer including a plurality of functional layers. When the emitting layer EML is provided as the multi-layer, the emitting layer EML may have a structure in which a hole injection layer, a hole transport layer, an emission layer, an electron transport layer, an electron injection layer, and the like may be stacked in a single or complex structure. The present disclosure is not necessarily limited thereto, and the emitting layer EML may have different structures. In addition, at least a portion of the emitting layer EML may be integrally formed with a plurality of first electrodes AD, or may be individually provided to each of the plurality of first electrodes AD. The color of light generated in the emitting layer EML may be one of red, green, blue, and white, but the present inventive concept is not limited thereto. For example, the color of light generated in a light generation layer of the emitting layer EML may be one of magenta, cyan, and yellow.

The second electrode CD may be disposed on the emitting layer EML. The second electrode CD may be a semi-transmissive reflective layer. For example, the second electrode CD may be a thin metal layer having a thickness, through which light emitted from the emitting layer EML may be transmitted. The second electrode CD may transmit a portion of the light emitted from the emitting layer EML therethrough, and may reflect the rest of the light emitted from the emitting layer EML.

The second electrode CD may include a material having a work function smaller than that of the transparent conductive layer. For example, the second electrode CD may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the emitting layer EML may not be transmitted through the second electrode CD, and the light reflected from the second electrode CD may be again reflected from the reflective layer. For example, the light emitted from the emitting layer EML may resonate between the reflective layer and the second electrode CD. The light extraction efficiency of the organic light emitting element OLED may be increased by the resonance of the light.

The distance between the reflective layer and the second electrode CD may be different depending on a color of the light emitted from the emitting layer EML. For example, the distance between the reflective layer and the second electrode CD may be adjusted to correspond to a resonance distance, depending on a color of the light emitted from the emitting layer EML.

An encapsulating member SLM that covers the second electrode CD may be provided over the second electrode CD. The encapsulating member SLM may prevent oxygen and moisture from penetrating into the light emitting element OLED. The encapsulating member SLM may include a plurality of inorganic layers or a plurality of organic layers. For example, the encapsulating member SLM may include a plurality unit encapsulation layers including an inorganic layer and an organic layer disposed on the inorganic layer.

In an embodiment of the present inventive concept, an embodiment where the encapsulating member SLM is applied to isolate the light emitting element OLED from an external environment is described as an example, but the present disclosure is not limited thereto. For example, an encapsulating substrate may be applied instead of the encapsulating member SLM to isolate the light emitting element OLED from the external environment. When the light emitting element OLED is isolated from the external environment by using the encapsulating substrate, the encapsulating member SLM may be omitted.

In general, the first buffer layer BFL1 that blocks impurities from being diffused into the first and second transistors Tdr and Tsw may be made of the inorganic insulating material. The inorganic insulating material may be brittle as compared with the organic insulating material, and therefore, cracks may be generated in the first buffer layer BFL1 by an external impact applied to the display device. In addition, the cracks may be generated in the first buffer layer BFL1 by the stress applied to the display device when the display device is folded or rolled.

The cracks generated in the first buffer layer BFL1 may advance toward the first and second gate insulating layers GI1 and GI2 made of the inorganic insulating material and then propagate to the second semiconductor layer SCSL of the second transistor Tsw. A failure may occur in the second semiconductor layer SCLS due to the cracks propagating to the second semiconductor layer SCLS, and therefore, device characteristics of the second transistor Tsw may be deteriorated. As a result, the reliability of the display device may be deteriorated.

Accordingly, in the present inventive concept, the crack blocking layer CBL may be disposed on the bottom of the second semiconductor layer SCLS, and the cracks generated in the first buffer layer BFL1 may be blocked from propagating to the second semiconductor layer SCLS. To this end, the crack blocking layer CBL may be made of the ductile metal in which no crack is generated even in a region in which the maximum elasticity deformation occurs, and only plasticity deformation occurs.

As described above, in the display device according to the embodiment of the present inventive concept, the cracks generated in the first buffer layer BFL1 may be prevented from propagating to the second semiconductor layer SCLS by using the crack blocking layer CBL, so that unique device characteristics of the second transistor Tsw can be maintained. As a result, the reliability of the display device according to the embodiment of the present inventive concept can be increased.

FIGS. 5A to 5K are process sectional views illustrating a manufacturing method of the display device shown in FIG. 4.

Figure 5A:
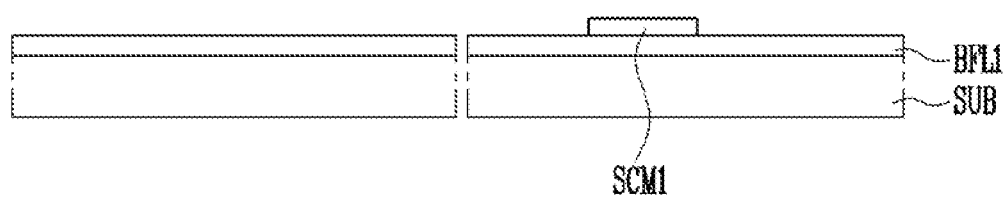
FIGS. 5A to 5K are process sectional views illustrating a manufacturing method of the display device shown in FIG. 4 according to an exemplary embodiment of the present inventive concept.

Referring to FIGS. 4 and 5A, the first buffer layer BFL1 including an inorganic insulating material may be formed on the substrate SUB. Subsequently, the first semiconductor material layer SCM1 may be formed on the first buffer layer BFL1.

Figure 5B:
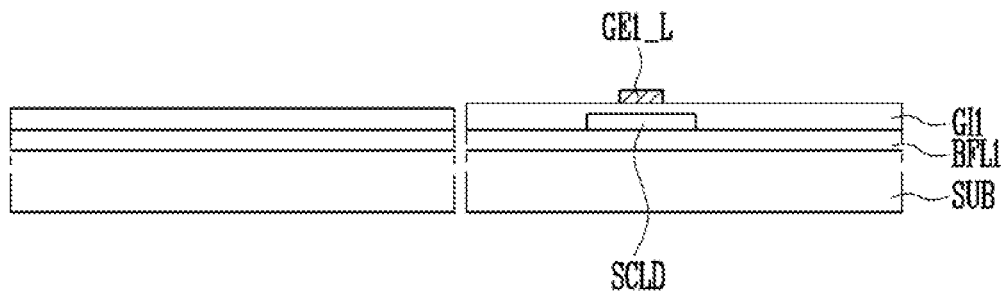

Referring to FIGS. 4 and 5B, a first gate insulating layer GI1 may be formed on the first semiconductor material layer (see, for example, SCM1 of FIG. 5A). Subsequently, a first gate lower electrode GE1_L overlapping with a portion of the first semiconductor material layer SCM1 may be formed on the first gate insulating layer GI1.

A first semiconductor layer SCLD may include the source region, the drain region, and the channel region, and may be formed by doping impurities into the first semiconductor material layer SCM1, using the first gate lower electrode GE1_L as a doping prevention layer.

Figure 5C:
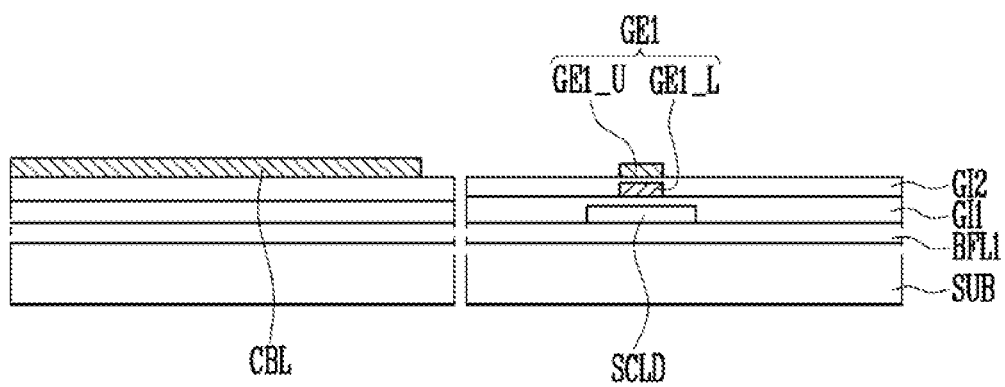

Referring to FIGS. 4 and 5C, the second gate insulating layer GI2 may be formed over the first semiconductor layer SCLD. The first gate upper electrode GE1_U and the crack blocking layer CBL may be formed on the second gate insulating layer GI2.

Figure 5D:
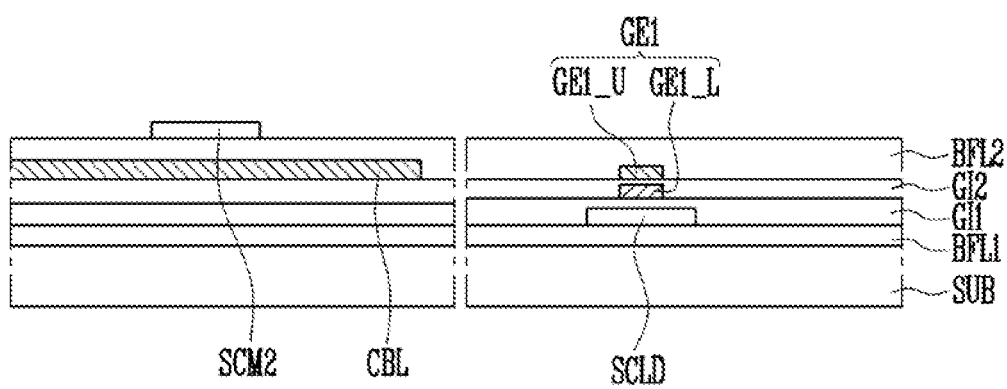

Referring to FIGS. 4 and 5D, the second buffer layer BFL2 may be formed over the first gate upper electrode GE1_U and the crack blocking layer CBL. A second semiconductor material layer SCM2 may be formed on the second buffer layer BFL2. The second semiconductor material layer SCM2 may be formed on the second buffer layer BFL2 to correspond to the crack blocking layer CBL. For example, the second semiconductor material layer SCM2 may overlapped with the crack blocking layer CBL when viewed from the top.

Figure 5E:
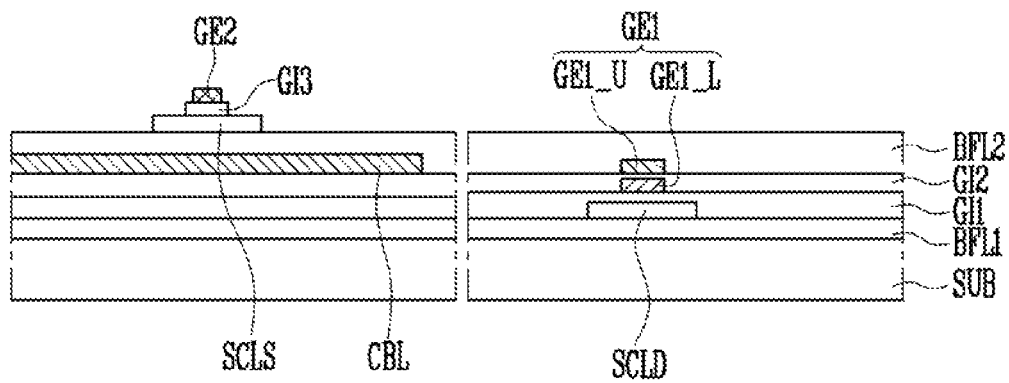

Referring to FIGS. 4 and 5E, the third gate insulating layer GI3 may be formed over the second semiconductor material layer (see, for example, SCM2 of FIG. 5D). The third gate insulating layer GI3 may be patterned to overlap with a portion of the second semiconductor material layer SCM2. The second gate electrode GE2 may be formed on the third gate insulating layer GI3. The second semiconductor layer SCLS including the source region, the drain region, and the channel region may be formed by doping impurities into the second semiconductor material layer SCM2, using the second gate electrode GE2 as the doping prevention layer.

Figure 5F:
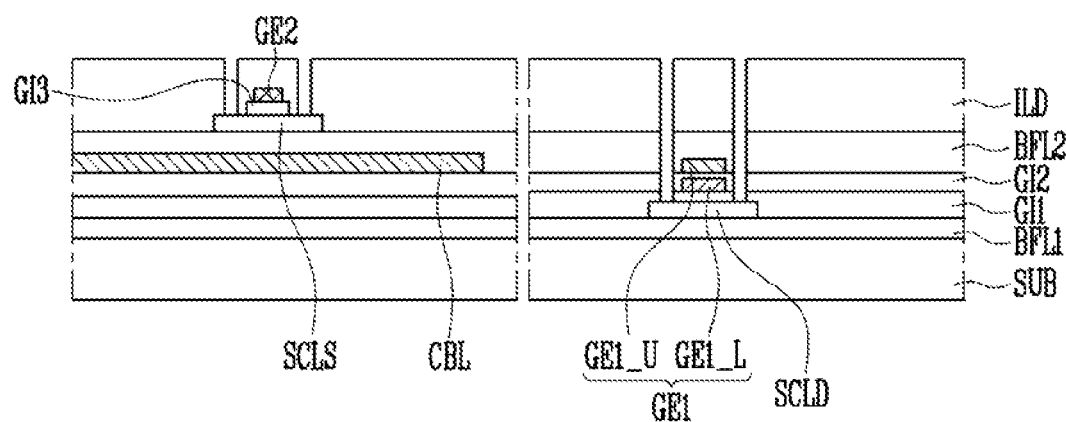

Referring to FIGS. 4 and 5F, the interlayer insulating layer ILD may be formed on the substrate SUB on which the second gate electrode GE2 is formed. The interlayer insulating layer ILD may be patterned to include contact holes that respectively expose the source region and the drain region of the second semiconductor layer SCLS therethrough. The interlayer insulating layer ILD, the second buffer layer BFL2, the second gate insulating layer GI2, and the first gate insulating layer GI1 may be simultaneously patterned to include contact holes that respectively expose the source region and the drain region of the first semiconductor layer SCLD therethrough.

Figure 5G:
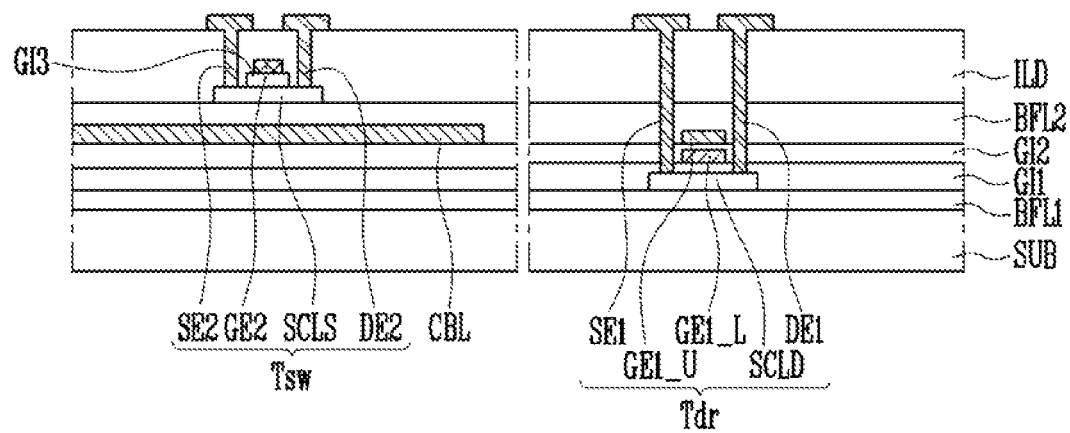

Referring to FIGS. 4 and 5G, first and second source electrodes SE1 and SE2 and first and second drain electrodes DE1 and DE2 may be formed on the interlayer insulating layer ILD. The first source electrode SE1 may be in contact with the source region of the first semiconductor layer SCLD, and the first drain electrode DE1 may be in contact with the drain region of the first semiconductor layer SCLD. The second source electrode SE2 may be in contact with the source region of the second semiconductor layer SCLS, and the second drain electrode DE2 may be in contact with the drain region of the second semiconductor layer SCLS.

Figure 5H:
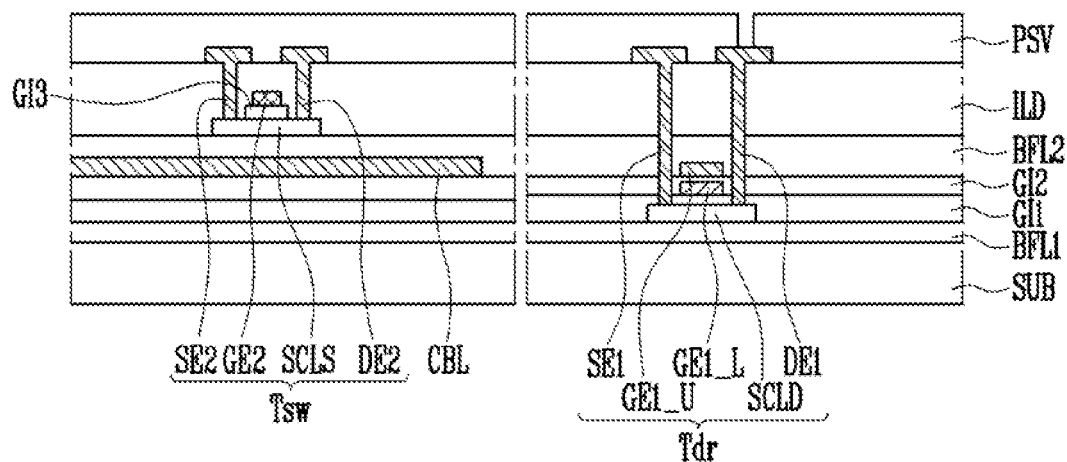

Referring to FIGS. 4 and 5H, the passivation layer PSV may be formed over the first and second source electrodes SE1 and SE2 and the first and second drain electrodes DE1 and DE2. The passivation layer PSV may be patterned to include a contact hole that exposes a portion of the first drain electrode DE1 therethrough.

Figure 5I:
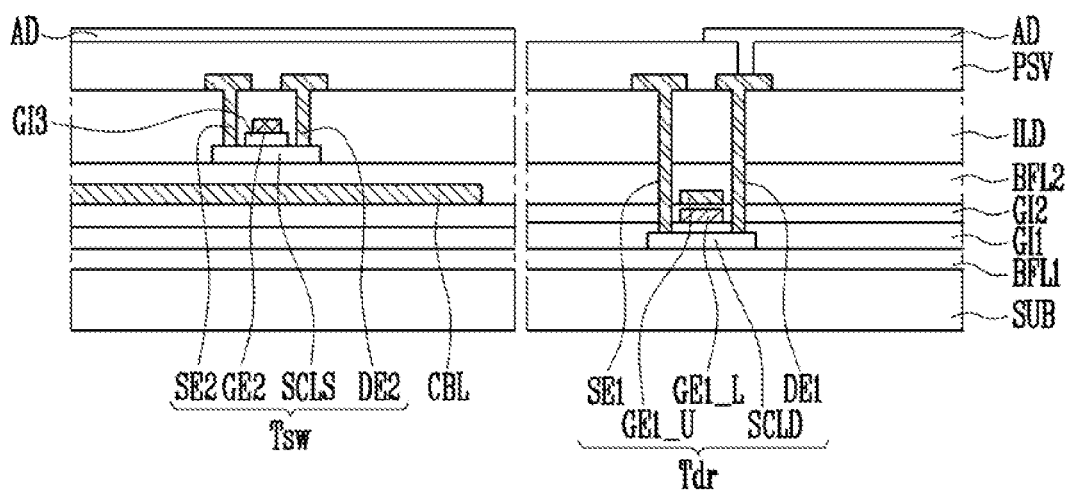

Referring to FIGS. 4 and 5I, the first electrode AD may be formed on the passivation layer PSV. The first electrode AD may be connected to the first drain electrode DE1 through a contact hole provided in the passivation layer PSV.

Figure 5J:
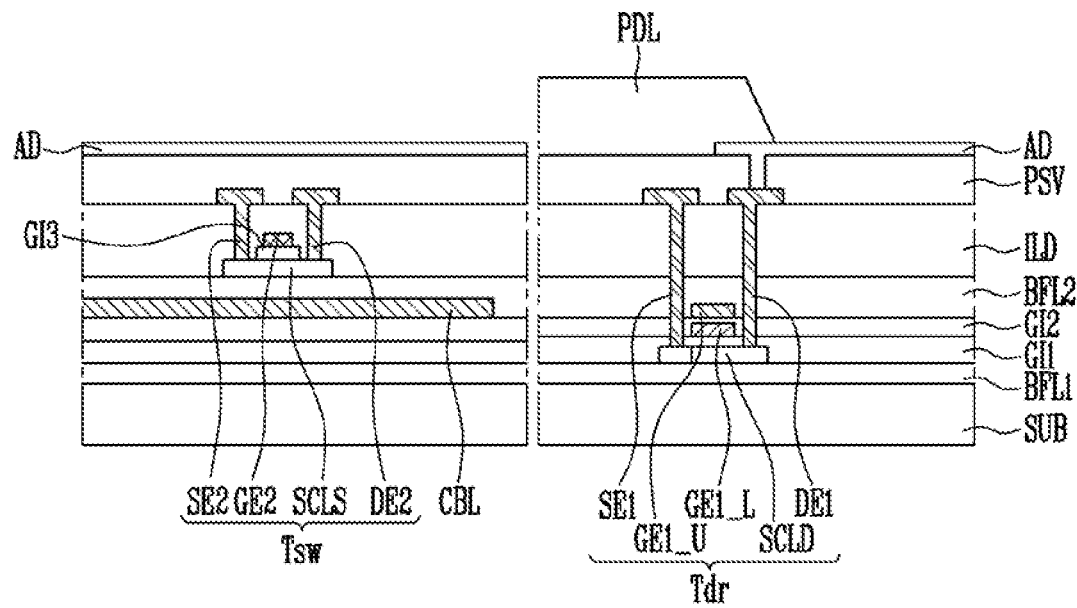

Referring to FIGS. 4 and 5J, the pixel defining layer PDL may be formed on the substrate SUB on which the first electrode AD is formed. The pixel defining layer PDL may be patterned to expose a portion of the surface of the first electrode AD therethrough.

Figure 5K:
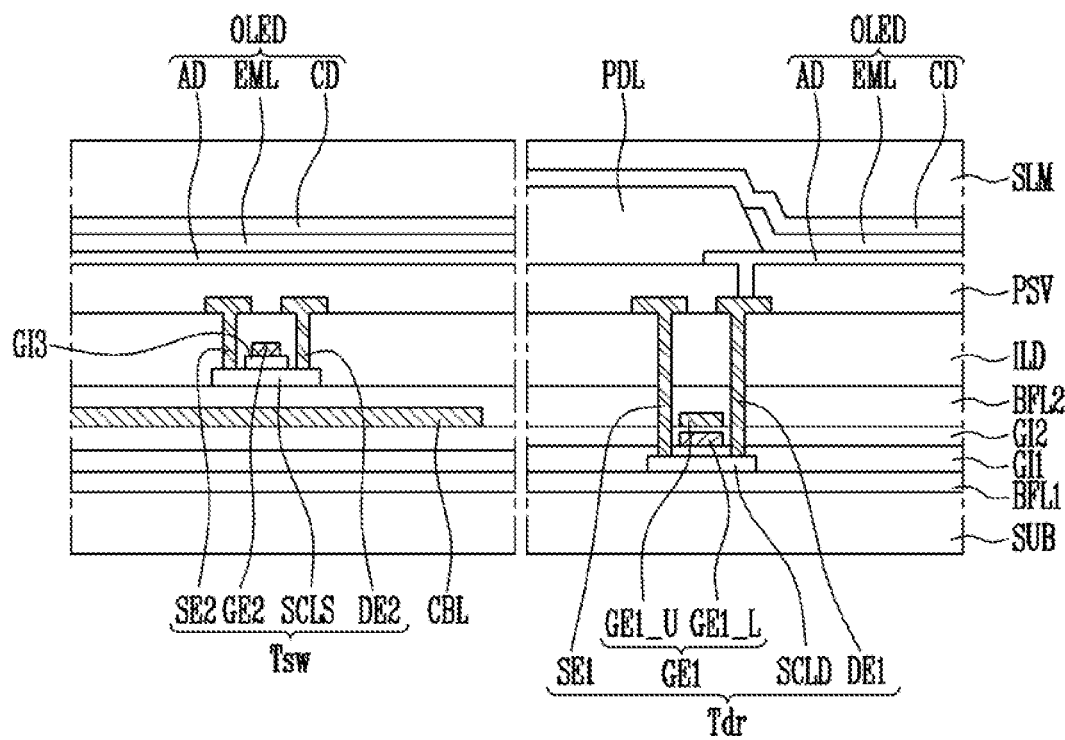

Referring to FIGS. 4 and 5K, the emitting layer EML may be formed on the first electrode AD having the exposed partial surface. Subsequently, the second electrode CD may be formed on the emitting layer EML, and the encapsulating member SLM that covers the second electrode CD may be formed.

Figure 6:
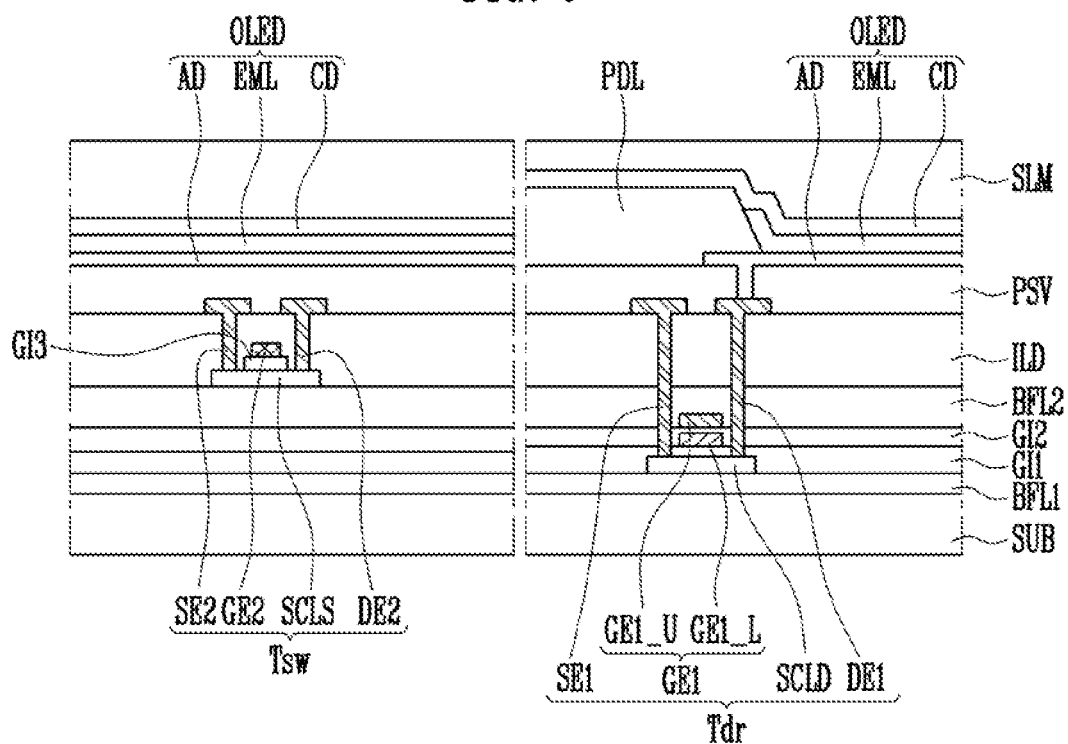
FIG. 6 is a sectional view illustrating a portion of a display device according to an exemplary embodiment of the present inventive concept.

FIG. 6 is a sectional view illustrating a portion of a display device according to another exemplary embodiment of the present inventive concept. In the embodiment of the present inventive concept, differences from the above-described embodiment will be mainly described to avoid redundancy. Portions not described in this embodiment follow those of the above-described embodiment. In addition, identical reference numerals may refer to identical components, and similar reference numerals may refer to similar components.

Referring to FIG. 6, the display device according to the embodiment of the present inventive concept may include the substrate SUB, first and second transistors Tdr and Tsw provided on the substrate SUB, and the light emitting element OLED.

The first buffer layer BFL1 may be disposed between the substrate SUB and the first and second transistors Tdr and Tsw. The first buffer layer BFL1 may include the inorganic insulating material.

The first transistor Tdr may include the first semiconductor layer SCLD, the first gate electrode GE1, the first source electrode SE1, and the first drain electrode DE1. The first semiconductor layer SCLD may include the semiconductor pattern made of amorphous silicon, polycrystalline silicon, single-crystalline silicon, or the like. The first gate electrode GE1 may include the first gate lower electrode GE1_L disposed on the first semiconductor layer SCLD with the first gate insulating layer GI interposed therebetween and the first gate upper electrode GE1_U disposed on the first gate lower electrode GE1_L with the second gate insulating layer GI2 interposed therebetween. Each of the first source electrode SE1 and the first drain electrode DE1 may be connected to the first semiconductor layer SCLD through a corresponding contact hole sequentially passing through the interlayer insulating layer ILD, the second buffer layer BFL2, the second gate insulating layer GI2, and the first gate insulating layer GI1.

The second transistor Tsw may include the second semiconductor layer SCLS, the second gate electrode GE2, the second source electrode SE2, and the second drain electrode DE2. The second semiconductor layer SCLS may be disposed on the second buffer layer BFL2 and include the oxide semiconductor. The second gate electrode GE2 may be disposed on the second semiconductor layer SCLS with the third gate insulating layer GI3 interposed therebetween. Each of the second source electrode SE2 and the second drain electrode DE2 may be connected to the second semiconductor layer SCLS through a corresponding contact hole passing through the interlayer insulating layer ILD.

The light emitting element OLED may be provided on the first and second transistors Tdr and Tsw. The encapsulating member SLM that covers the light emitting element OLED may be provided over the light emitting element OLED.

In an exemplary embodiment of the present inventive concept, the second buffer layer BFL2 may be disposed on the entire surface of the substrate SUB between the second gate insulating layer GI2 and the second semiconductor layer SCLS. The second buffer layer BFL2 may be the crack blocking layer that serves as the barrier when cracks are generated in the first buffer layer BFL1 disposed on the bottom of the second transistor Tsw, thereby blocking the propagation of the cracks. Also, the second buffer layer BFL2 may have a thickness ranging from about 5,000 Å to about 30,000 Å.

In one embodiment, the second buffer layer BFL2 may include the organic insulating material including the organic material. The organic insulating material may include a plastic organic material in which no crack is generated even in a region in which the maximum elasticity deformation occurs, and only plasticity deformation occurs. In an embodiment of the present inventive concept, the plastic organic material may include at least one of polyimide (PI), siloxane based resin, silane based resin, polyamide (PA), polyarylether (PAE), epoxy, benzocyclobutene (BCB), polystyrene, polymethylmethacrylate (PMMA), and polyacrylonitrile (PAN).

Although cracks may be generated in the first buffer layer BFL1 that is brittle, the cracks can be prevented from propagating to the second semiconductor layer SCLS due to material characteristics of the second buffer layer BFL2. Accordingly, unique device characteristics of the second transistor Tsw can be maintained.

Figure 7:
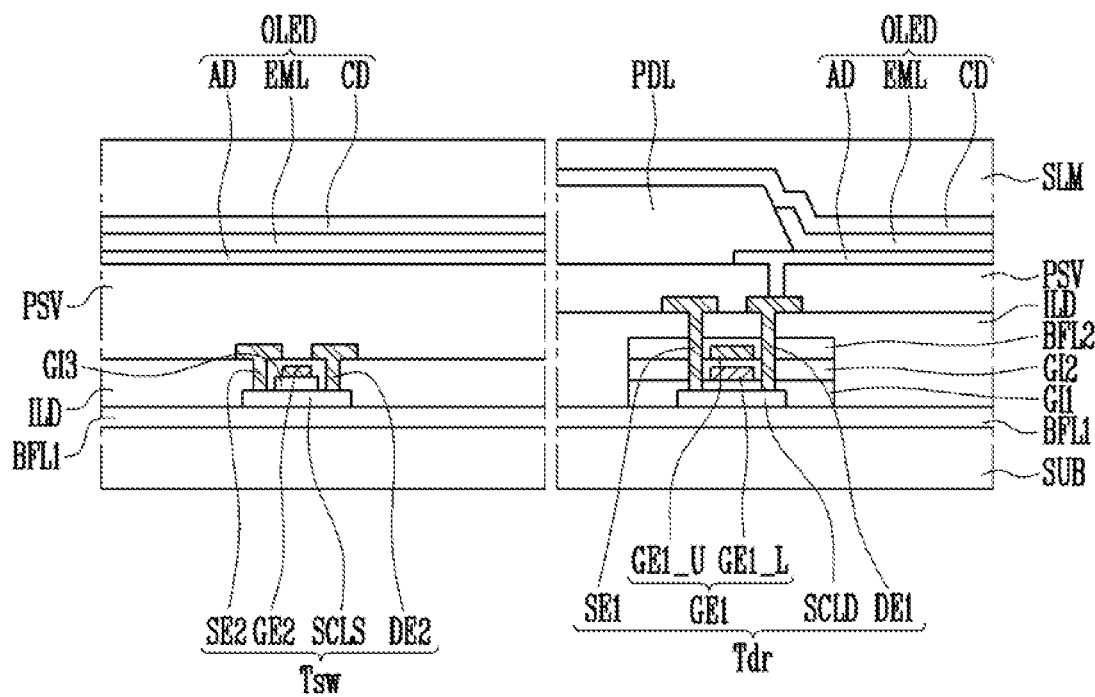
FIG. 7 is a sectional view illustrating a portion of a display device according to an exemplary embodiment of the present inventive concept.

FIG. 7 is a sectional view illustrating a portion of a display device according to still another exemplary embodiment of the present inventive concept. In the embodiment of the present inventive concept, differences from the above-described embodiment will be mainly described to avoid redundancy. Portions not particularly described in this embodiment follow those of the above-described embodiment. In addition, identical reference numerals may refer to identical components, and similar reference numerals may refer to similar components.

Referring to FIG. 7, the display device according to the embodiment of the present inventive concept may include the substrate SUB, first and second transistors Tdr and Tsw disposed on the substrate SUB, and the light emitting element OLED.

The first buffer layer BFL1 may be disposed between the substrate SUB and the first and second transistors Tdr and Tsw. The first buffer layer BFL1 may include the inorganic insulating material.

The first transistor Tdr may include the first semiconductor layer SCLD, the first gate electrode GE1, the first source electrode SE1, and the first drain electrode DE1. The second transistor Tsw may include the second semiconductor layer SCLS, the second gate electrode GE2, the second source electrode SE2, and the second drain electrode DE2.

The light emitting element OLED may include the first electrode AD, the second electrode CD, and the emitting layer EML disposed between the two electrodes AD and CD.

Hereinafter, a structure of the display device according to the exemplary embodiment of the present inventive concept will be described along a stacking order with reference back to FIG. 7.

The first buffer layer BFL1 may be disposed on the substrate SUB. The first buffer layer BFL1 may prevent impurities from being diffused into the first transistor Tdr.

The first semiconductor layer SCLD may be disposed on the first buffer layer BFL1. The first semiconductor layer SCLD may include the semiconductor pattern made of amorphous silicon, polycrystalline silicon, single-crystalline silicon, or the like.

The first gate insulating layer GI1 may be disposed on the first semiconductor layer SCLD. The first gate lower electrode GE1_L may be disposed on the first gate insulating layer GI1. The second gate insulating layer GI2 may be provided over the first gate lower electrode GE1_L. The first gate upper electrode GE1_U may be disposed on the second gate insulating layer GI2. The second buffer layer BFL2 may be provided over the first gate upper electrode GE1_U.

In an embodiment of the present inventive concept, the first gate insulating layer GI1, the second gate insulating layer GI2, and the second buffer layer BFL2 may be patterned in an island shape to be disposed only in a partial region of the substrate SUB on which the first transistor Tdr is provided. For example, the first gate insulating layer GI1, the second gate insulating layer GI2, and the second buffer layer BFL2 may be removed in the remaining region except the partial region of the substrate SUB on which the first transistor Tdr is provided. Therefore, an opening that exposes a surface of the first buffer layer BFL1 therethrough may be disposed on the substrate SUB.

The second semiconductor layer SCLS may be disposed on the substrate SUB from which the first gate insulating layer GI1, the second gate insulating layer GI2, and the second buffer layer BFL2 are removed. For example, the second semiconductor layer SCLS may be disposed on the first buffer layer BFL1 of which surface is exposed through the opening. Therefore, the first semiconductor layer SCLD of the first transistor Tdr and the second semiconductor layer SCLS of the second transistor Tsw may be provided on the same layer, for example, the first buffer layer BFL1.

The third gate insulating layer GI3 may be provided over the second semiconductor layer SCLS. The third gate insulating layer GI3 may be patterned to overlap with a partial region, for example, the channel region, of the second semiconductor layer SCLS.

The second gate electrode GE2 may be disposed on the third gate insulating layer GI3.

The interlayer insulating layer ILD may be disposed on the substrate SUB on which the second gate electrode GE2 is provided.

The first and second source electrodes SE1 and SE2 and the first and second drain electrodes DE1 and DE2 may be disposed on the interlayer insulating layer ILD.

The first source electrode SE1 may be in contact with the source region of the first semiconductor layer SCLD through a contact hole sequentially passing through the interlayer insulating layer ILD, the second buffer layer BFL2, and the second and first gate insulating layers GI2 and GI1. The first drain electrode DE1 may be in contact with the drain region of the first semiconductor layer SCLD through a contact hole sequentially passing through the interlayer insulating layer ILD, the second buffer layer BFL2, and the second and first gate insulating layers GI2 and GI1.

The second source electrode SE2 may be in contact with the source region of the second semiconductor layer SCLS through a contact hole passing through the interlayer insulating layer ILD. The second drain electrode DE2 may be in contact with the drain region of the second semiconductor layer SCLS through a contact hole passing through the interlayer insulating layer ILD.

The passivation layer PSV may be provided over the first and second transistors Tdr and Tsw.

The light emitting element OLED may be disposed on the passivation layer PSV.

In an embodiment of the present inventive concept, the first gate insulating layer GI1, the second gate insulating layer GI2, and the second buffer layer BFL2 may be patterned, and the first gate insulating layer GI1, the second gate insulating layer GI2, and the second buffer layer BFL2 may be disposed only in the partial region of the substrate SUB on which the first transistor Tdr is provided. In this case, the first gate insulating layer GI1, the second gate insulating layer GI2, and the second buffer layer BFL2 may have the island shape on the substrate SUB on which the first transistor Tdr is provided, and be removed on the substrate SUB on which the second transistor Tsw is provided. Hereinafter, for convenience of description, the first gate insulating layer GI1, the second gate insulating layer GI2, and the second buffer layer BFL2, which have the island shape on the substrate SUB, may be referred to as the island insulating pattern.

In an embodiment of the present disclosure, an opening in which the first gate insulating layer GI1, the second gate insulating layer GI2, and the second buffer layer BFL2 are removed may be provided on the substrate SUB on which the second transistor Tsw is provided.

As described above, the island insulating pattern may be provided on the substrate SUB on which the first transistor Tdr is provided, and the opening may be provided on the substrate SUB on which the second transistor Tsw is provided. The island insulating pattern and the opening, which are provided on the substrate SUB, may structurally reduce the stress applied to the display device by the external impact and the stress applied to the display device when the display device is folded. Accordingly, it may be possible to minimize the generation of cracks in the first buffer layer BFL1.

FIGS. 8A to 8L are process sectional views illustrating a manufacturing method of the display device shown in FIG. 7.

Figure 8A:
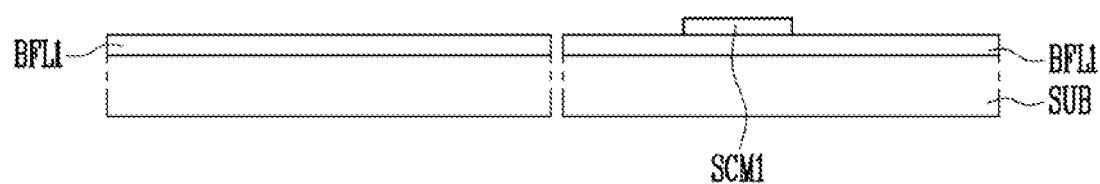
FIGS. 8A to 8L are process sectional views illustrating a manufacturing method of the display device shown in FIG. 7 according to an exemplary embodiment of the present inventive concept.

Referring to FIGS. 7 and 8A, the first buffer layer BFL1 may be formed on the substrate SUB. Subsequently, the first semiconductor material layer SCM1 may be formed on the first buffer layer BFL1.

Figure 8B:
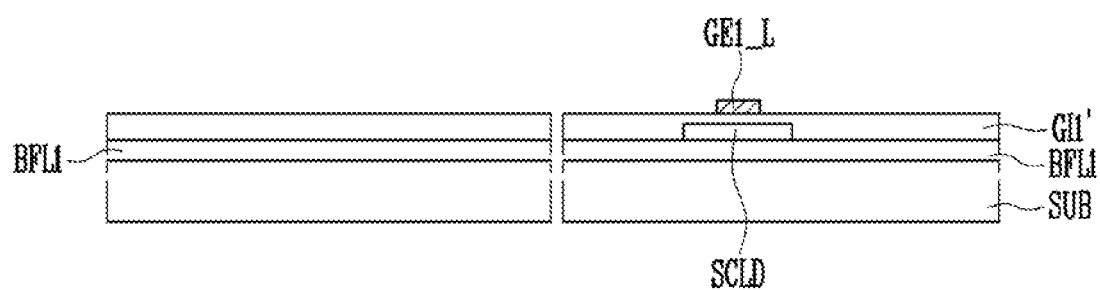

Referring to FIGS. 7 and 8B, a first gate insulating material layer GI1' may be formed on the first semiconductor material layer (see, for example, SCM1 of FIG. 8A). Subsequently, the first gate lower electrode GE1_L overlapping with a portion of the first semiconductor material layer SCM1 may be formed on the first gate insulating material layer GI1'.

The first semiconductor layer SCLD including the source region, the drain region, and the channel region is formed by doping impurities into the first semiconductor material layer SCM1, using the first gate lower electrode GE1_L as the doping prevention layer.

Figure 8C:
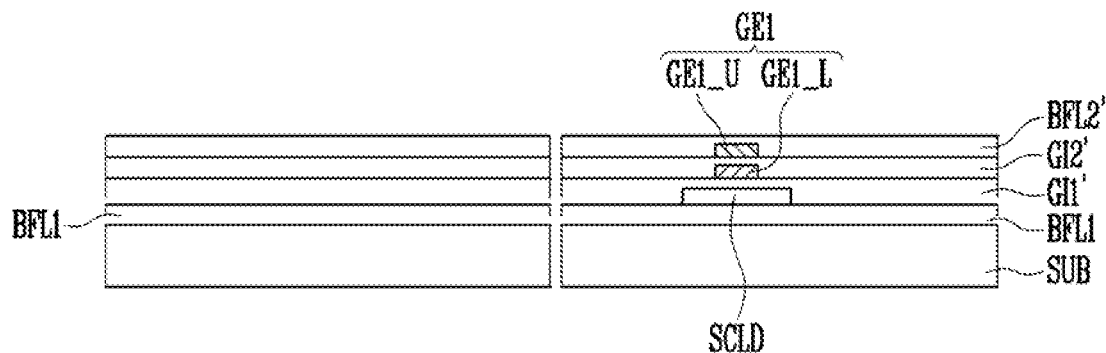

Referring to FIGS. 7 and 8C, a second gate insulating material layer GI2' may be formed over the first semiconductor layer SCLD. The first gate upper electrode GE1_U may be formed on the second gate insulating material layer GI2'. A second buffer material layer BFL2' may be formed over the first gate upper electrode GE1_U.

Figure 8D:
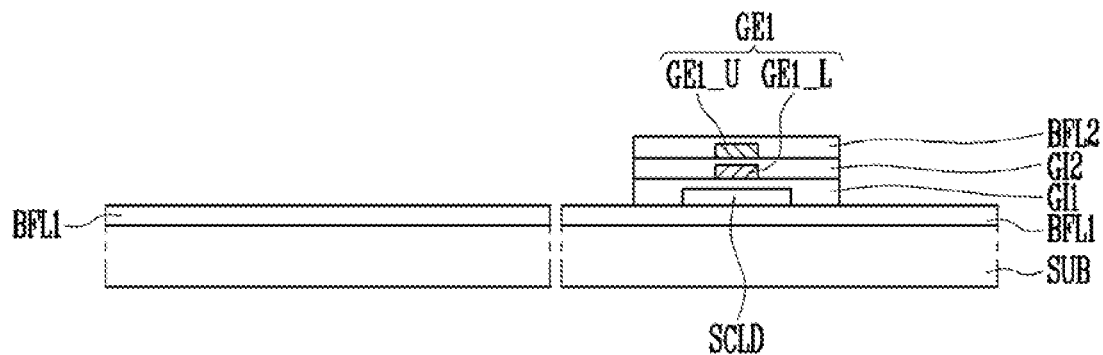

Referring to FIGS. 7 and 8D, the second buffer material layer (see, for example, BFL2' of FIG. 8C), the second gate insulating material layer (see, for example, GI2' of FIG. 8C), and the first gate insulating material layer (see, for example, GI1' of FIG. 8C) may be simultaneously patterned to be disposed on only the substrate SUB on which the first semiconductor layer SCLD is provided. The first gate insulating material layer GI1' may be patterned only in a partial region of the substrate SUB, and may become the first gate insulating layer GI1. The second gate insulating material layer GI2' may be patterned only in the partial region of the substrate SUB, and may become the second gate insulating layer GI2. The second buffer material layer BFL2' may be patterned only in the partial region of the substrate SUB, and may become the second buffer layer BFL2. Here, an opening in which the first gate insulating layer GI1, the second gate insulating layer GI2, and the second buffer layer BFL2 are removed may be provided on the substrate SUB on which a second semiconductor layer to be formed through a subsequent process is provided.

Figure 8E:
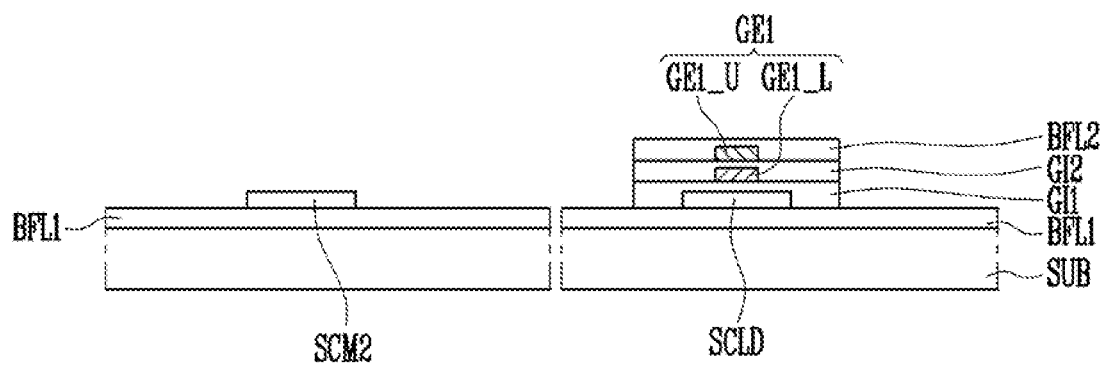

Referring to FIGS. 7 and 8E, the second semiconductor material layer SCM2 may be formed on the substrate SUB including the second buffer layer BFL2. The second semiconductor material layer SCM2 may be formed on the first buffer layer BFL1 of which surface is exposed through the opening. The second semiconductor material layer SCM2 may be disposed on the same layer, for example, the first buffer layer BFL1, as the first semiconductor layer SCLD.

Figure 8F:
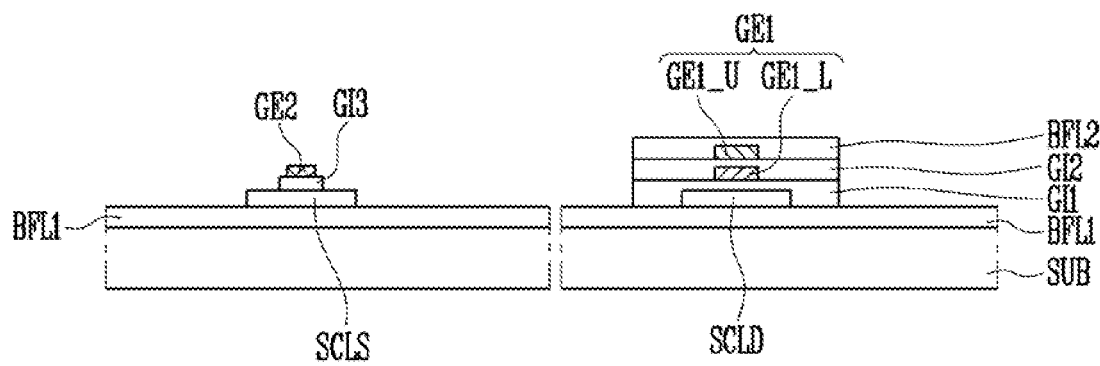

Referring to FIGS. 7 and 8F, the third gate insulating layer GI3 may be formed over the second semiconductor material layer (see, for example, SCM2 of FIG. 8E). The third gate insulting layer GI3 may be patterned to overlap with a portion of the second semiconductor material layer SCM2. The second gate electrode GE2 may be formed on the third gate insulating layer GI3. The second semiconductor layer SCLS including the source region, the drain region, and the channel region may be formed by doping impurities into the second semiconductor material layer SCM2, using the second gate electrode GE2 as the doping prevention layer.

Figure 8G:
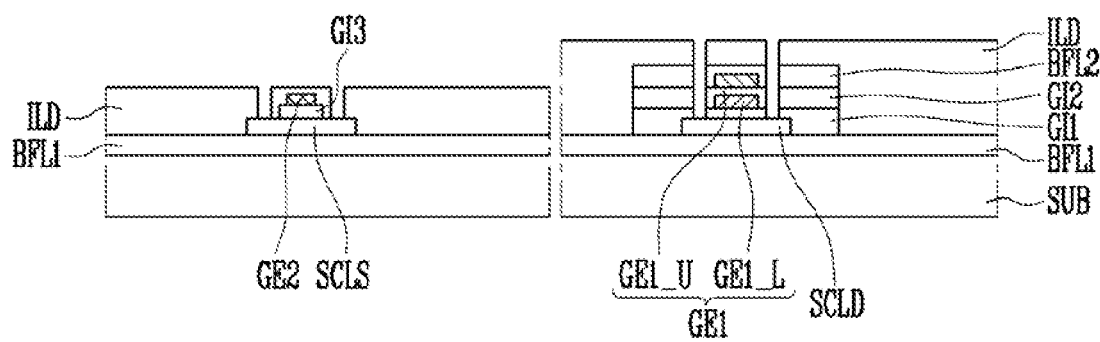

Referring to FIGS. 7 and 8G, the interlayer insulating layer ILD may be formed on the entire surface of the substrate SUB including the second gate electrode GE2.

In one example, the interlayer insulating layer ILD corresponding to the second semiconductor layer SCLS may be patterned to include contact holes that respectively expose the source region and the drain region of the second semiconductor layer SCLS therethrough. In another example, the interlayer insulating layer ILD, the second buffer layer BFL2, the second gate insulating layer GI2, and the first gate insulating layer GI1, which correspond to the first semiconductor layer SCLD, may be simultaneously patterned to include contact holes that respectively expose the source region and drain region of the first semiconductor layer SCLD therethrough.

Figure 8H:
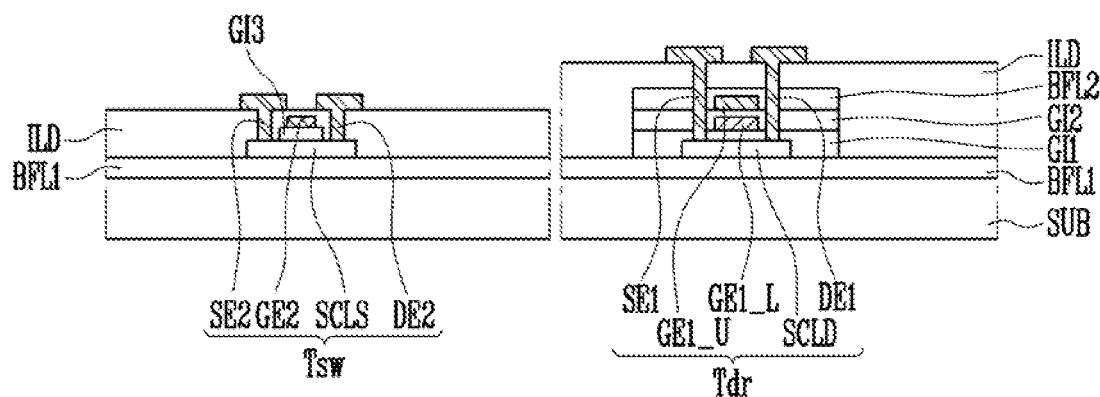

Referring to FIGS. 7 and 8H, first and second source electrodes SE1 and SE2 and first and second drain electrodes DE1 and DE2 may be formed on the interlayer insulating layer ILD.

Figure 8I:
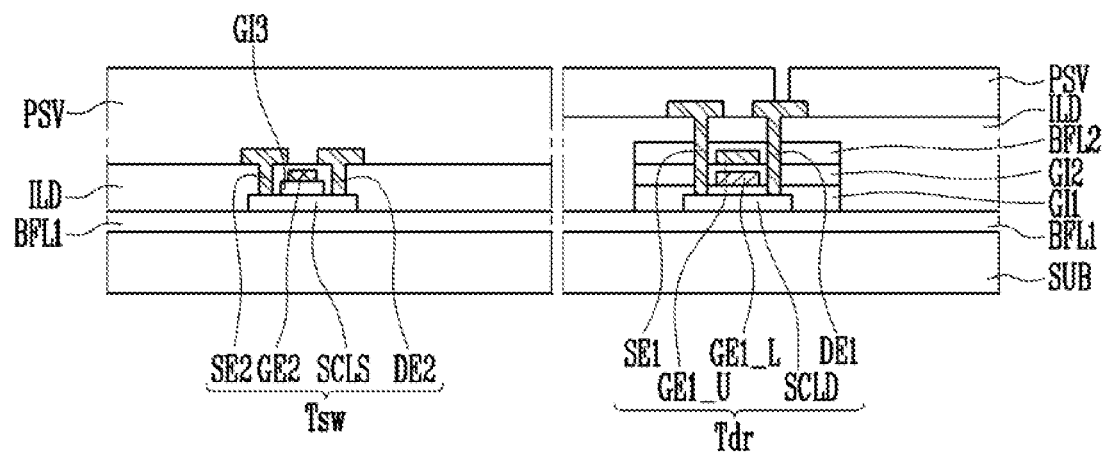

Referring to FIGS. 7 and 8I, the passivation layer PSV may be formed on the first and second source electrodes SE1 and SE2 and the first and second drain electrodes DE1 and DE2. The passivation layer PSV may be patterned to include a contact hole that exposes a portion of the first drain electrode DE1 therethrough.

Figure 8J:
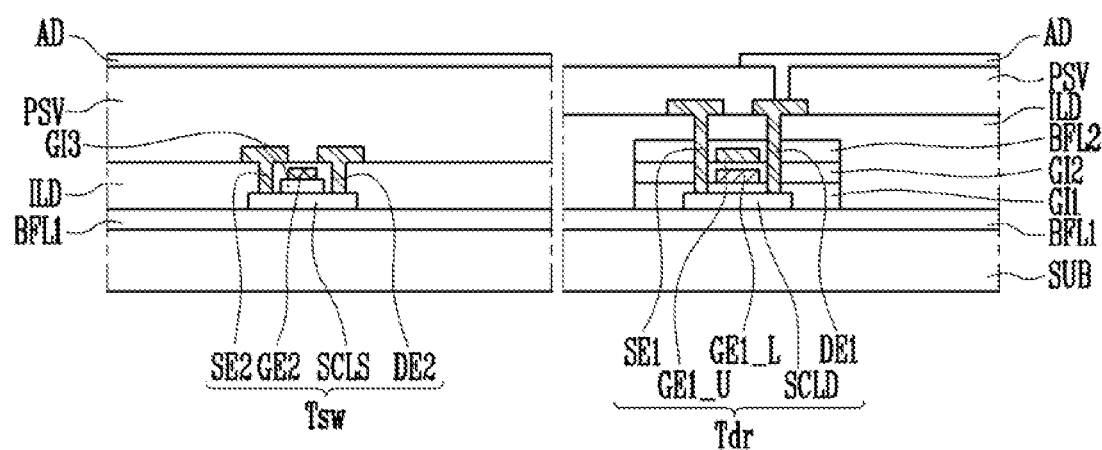

Referring to FIGS. 7 and 8J, the first electrode AD may be formed on the passivation layer PSV. The first electrode AD may be connected to the first drain electrode DE1 through the contact hole provided in the passivation layer PSV.

Figure 8K:
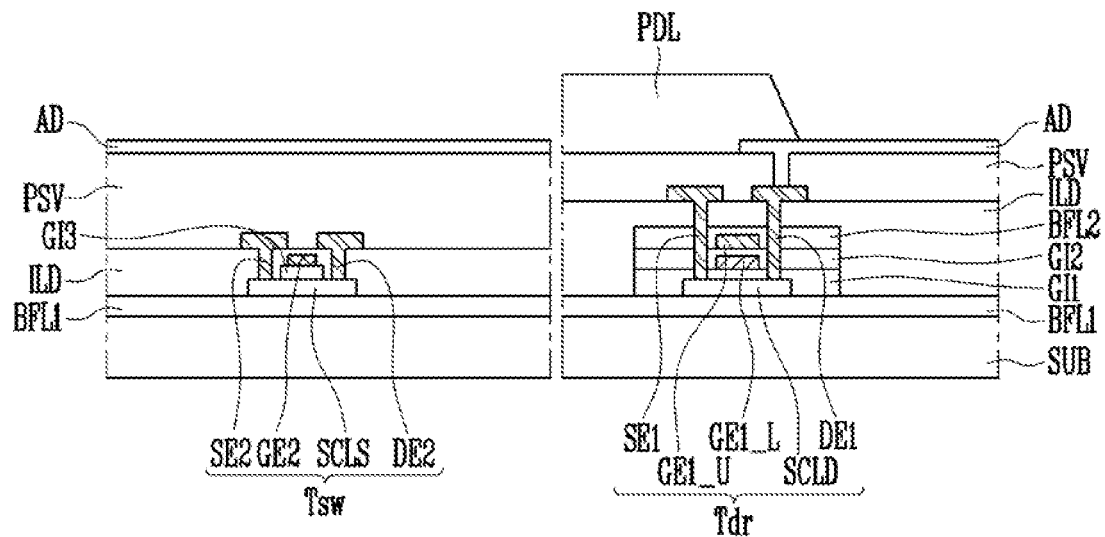

Referring to FIGS. 7 and 8K, the pixel defining layer PDL may be formed on the substrate SUB on which the first electrode AD is formed. The pixel defining layer PDL may be patterned to expose a partial surface of the first electrode AD therethrough.

Figure 8L:
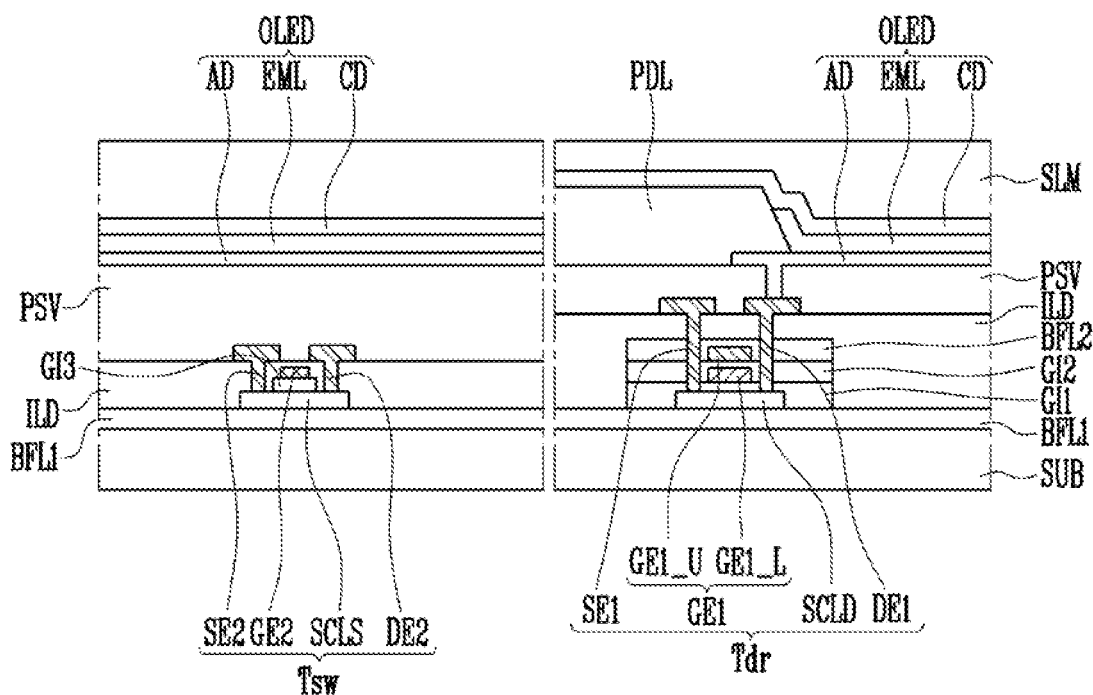

Referring to FIGS. 7 and 8L, the emitting layer EML may be formed on the first electrode AD of which partial surface is exposed. The second electrode CD may be formed on the emitting layer EML, and the encapsulating member SLM that covers the second electrode CD may be formed.

Figure 9:
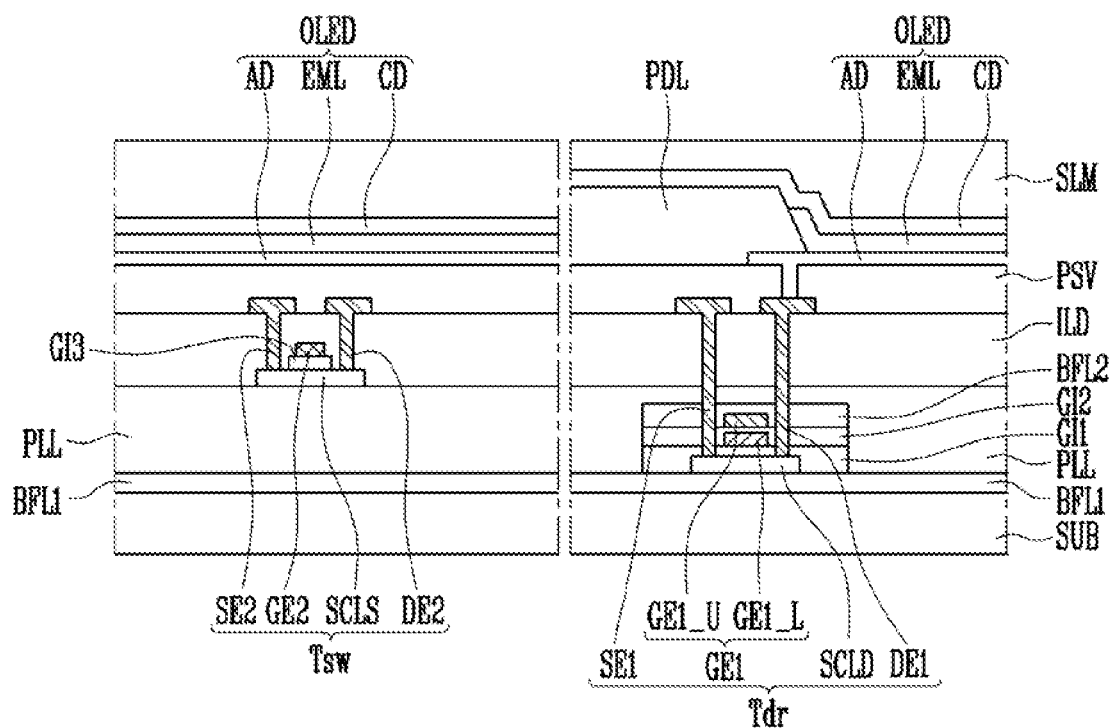
FIG. 9 is a sectional view illustrating a portion of a display device according to an exemplary embodiment of the present inventive concept.

FIG. 9 is a sectional view illustrating a portion of a display device according to still another exemplary embodiment of the present inventive concept. In the embodiment of the present inventive concept, differences from the above-described embodiment will be mainly described to avoid redundancy. Portions not particularly described in this embodiment follow those of the above-described embodiment. In addition, identical reference numerals may refer to identical components, and similar reference numerals may refer to similar components.

Referring to FIG. 9, the display device according to the embodiment of the present inventive concept may include the substrate SUB, first and second transistors Tdr and Tsw provided on the substrate SUB, and the light emitting element OLED.

The first buffer layer BFL1 may be disposed between the substrate SUB and the first and second transistors Tdr and Tsw. The first buffer layer BFL1 may include the inorganic insulating material.

The first transistor Tdr may include the first semiconductor layer SCLD, the first gate electrode GE1, the first source electrode SE1, and the first drain electrode DE1.

The first semiconductor layer SCLD may be disposed on the first buffer layer BFL1, and include the semiconductor pattern made of amorphous silicon, polycrystalline silicon, single-crystalline silicon, or the like. The first gate electrode GE1 may include the first gate lower electrode GE1_L disposed on the first semiconductor layer SCLD with the first gate insulating layer GI1 interposed therebetween and the first gate upper electrode GE1_U disposed on the first gate lower electrode GE1_L with the second gate insulating layer GI2 interposed therebetween. Each of the first source electrode SE1 and the first drain electrode DE may be connected to the first semiconductor layer SCLD through corresponding contact holes sequentially passing through the interlayer insulating layer ILD, a planarization layer PLL, the second buffer layer BFL2, the second gate insulating layer GI2, and the first gate insulating layer GI1.

The second transistor Tsw may include the second semiconductor layer SCLS, the second gate electrode GE2, the second source electrode SE2, and the second drain electrode DE2.

The second semiconductor layer SCLS may be disposed on the planarization layer PLL and include the oxide semiconductor. The second gate electrode GE2 may be disposed on the second semiconductor layer SCLS with the third gate insulating layer GI3 interposed therebetween. Each of the second source electrode SE2 and the second drain electrode DE2 may be connected to the second semiconductor layer SCLS trough corresponding contact holes passing through the planarization layer PLL.

The light emitting element OLED may be disposed on the first and second transistors Tdr and Tsw. The encapsulating member SLM that covers the light emitting element OLED may be provided over the light emitting element OLED.

Figure 10:
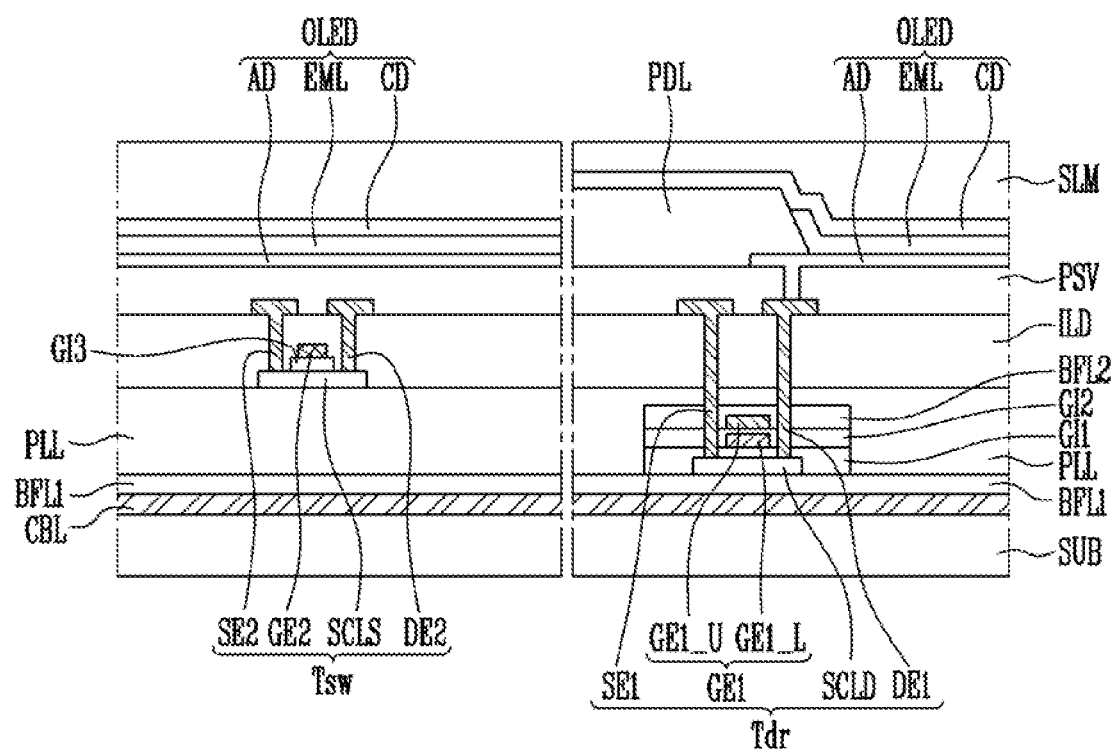
FIG. 10 is a sectional view illustrating a portion of a display device according to an exemplary embodiment of the present inventive concept.

FIG. 10 is a sectional view illustrating a portion of a display device according to an exemplary embodiment of the present inventive concept. Portions not described in this embodiment follow those of the above-described embodiment in FIG. 9. In addition, identical reference numerals may refer to identical components, and similar reference numerals may refer to similar components.

Referring to FIG. 10, the crack blocking layer CBL may be disposed on the substrate SUB. The crack blocking layer CBL may include the ductile metal, for example, titanium (ii), copper (Cu), aluminum (Al), and any alloy thereof, or the double layer, for example, TiNx/Al, TiNx/Al-alloy, Ti/Cu, and the like, or the triple layer, for example, Ti/TiNx/Al, Ti/TiNx/Al-alloy, and the like. The crack blocking layer CBL may be disposed on the entire surface of the substrate SUB. Alternately the crack blocking layer CBL may be disposed on a portion of the surface of the substrate SUB.

Subsequently the first buffer layer BFL1 may be disposed on the crack blocking layer CBL. Accordingly, at least a portion of the first buffer layer BFL1 may be positioned between the crack blocking layer CBL and the planarization layer PLL, and the first buffer layer BFL1 may be less prone to generating cracks in the first buffer layer BFL1.

In an embodiment of the present inventive concept, the first gate insulating layer GI1, the second gate insulating layer GI2, and the second buffer layer BFL2 may include the inorganic insulating material, and be patterned in the island shape to be disposed in a partial region of the substrate SUB on which the first transistor Tdr is provided. In one example, the first gate insulating layer GI1, the second gate insulating layer GI2, and the second buffer layer BFL2 may be removed in the remaining region except the partial region of the substrate SUB on which the first transistor Tdr is provided, e.g., a region in which the second transistor Tsw is provided. Therefore, an opening that exposes a surface of the first buffer layer BFL1 therethrough may be provided on the substrate SUB.

As described above, the first and second gate insulating layers GI1 and GI2 and the second buffer layer BFL2 may be patterned in the island shape, and may be provided on the substrate SUB on which the first transistor Tdr is provided. The opening may be provided on the substrate SUB on which the second transistor Tsw is provided. Such a structure may reduce the stress applied to the display device by the external impact and the stress applied to the display device when the display device is folded.

Also, in an exemplary embodiment of the present inventive concept, the planarization layer PLL may be disposed between the second semiconductor layer SCLS and the substrate SUB, and may be provided on the entire surface of the substrate SUB. The planarization layer PLL may reduce a step difference generated by the first and second gate insulating layers GI1 and GI2 and the second buffer layer BFL2, which are patterned in the island shape on the substrate SUB, and the opening, so that it is possible to planarize an interface at which the second semiconductor layer SCLS is provided.

The planarization layer PLL may be the crack blocking layer that serves as the barrier when cracks are generated in the first buffer layer BFL1, thereby blocking the propagation of the cracks. To this end, the planarization layer PLL may include the organic insulating material including the plastic organic material in which no crack is generated even in a region in which the maximum elasticity deformation occurs, and only plasticity deformation occurs. For example, the plastic organic material may include at least one of polyimide (PI), siloxane based resin, silane based resin, polyamide (PA), polyarylether (PAE), epoxy, benzocyclobutene (BCB), polystyrene, polymethylmethacrylate (PMMA), and polyacrylonitrile (PAN).

Although cracks may be generated in the first buffer layer BFL1, the cracks can be prevented from propagating to the second semiconductor layer SCLS due to material characteristics of the planarization layer PLL. Accordingly, unique device characteristics of the second transistor Tsw can be maintained, and the reliability of the display device may be increased.

The display device according to the embodiment of the present disclosure can be employed in various types of electronic devices. For example, the display device may be applicable to televisions, notebook computers, cellular phones, smart phones, smart pads, PMPs, PDAs, navigations, various wearable devices such as smart watches, and the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
   a substrate including a pixel region and a peripheral region;
   a plurality of pixels provided in the pixel region of the substrate, the plurality of pixels displaying an image;
   a light emitting element provided in each pixel, the light emitting element emitting light corresponding to the image;
   a first transistor provided in each pixel, the first transistor driving the light emitting element, and a second transistor connected to the first transistor;
   an insulating layer disposed between a second semiconductor layer of the second transistor and the substrate; and
   a crack blocking layer disposed between the insulating layer and the second semiconductor layer of the second transistor,
   wherein a first semiconductor layer of the first transistor and the second semiconductor layer of the second transistor are provided in layers different from each other.

2. The display device of claim 1, wherein the crack blocking layer is provided in the same layer as a portion of the first transistor.

3. The display device of claim 2, wherein the first transistor further includes:
   a lower gate electrode disposed on the semiconductor layer with a first gate insulating layer interposed therebetween;
   an upper gate electrode disposed on the lower gate electrode with a second gate insulating layer interposed therebetween; and
   a source electrode and a drain electrode, each connected to the first semiconductor layer,
   wherein the crack blocking layer is provided in the same layer as the upper gate electrode and includes the same material as the upper gate electrode, and
   wherein the first semiconductor layer is disposed on the substrate.

4. The display device of claim 3, wherein the first gate insulating layer, the second gate insulating layer, and the insulating layer are disposed on the entire surface of the substrate.

5. The display device of claim 3, wherein the first gate insulating layer, the second gate insulating layer, and the insulating layer are patterned in an island shape to be disposed only on a portion of the substrate on which the first transistor is disposed.

6. The display device of claim 5, further comprising a planarization layer including an organic material and disposed on the insulating layer patterned in the island shape.

7. The display device of claim 6, wherein the second semiconductor layer of the second transistor is disposed on the planarization layer.

8. The display device of claim 1, wherein the first semiconductor layer of the first transistor includes a semiconductor pattern made of any one of amorphous silicon, polycrystalline silicon, and single-crystalline silicon, and
the second semiconductor layer of the second transistor includes an oxide semiconductor.

9. The display device of claim 1, wherein the crack blocking layer includes a ductile metallic material.

10. The display device of claim 9, wherein the crack blocking layer has a thickness of about 1,000 Å to about 10,000 Å.

11. A display device comprising:
a substrate including a pixel region and a peripheral region;
a plurality of pixels provided in the pixel region of the substrate, the plurality of pixels displaying an image;
a light emitting element provided in each pixel, the light emitting element emitting light corresponding to the image;
a first transistor provided in each pixel, the first transistor driving the light emitting element, and a second transistor connected to the first transistor; and
a crack blocking layer disposed between a second semiconductor layer of the second transistor and the substrate, the crack blocking layer including an organic insulating material,
wherein a first semiconductor layer of the first transistor and the second semiconductor layer of the second transistor are provided in layers different from each other.

12. The display device of claim 11, wherein the crack blocking layer is disposed on the entire surface of the substrate.

13. The display device of claim 11, wherein the crack blocking layer includes at least one of polyimide (PI), siloxane based resin, silane based resin, polyamide (PA), polyarylether (PAE), epoxy, benzocyclobutene (BCB), polystyrene, polymethylmethacrylate (PMMA), and polyacrylonitrile (PAN).

14. The display device of claim 13, wherein the crack blocking layer has a thickness of about 5,000 Å to about 30,000 Å.

15. The display device of claim 11, further comprising:
an auxiliary crack blocking layer disposed between an insulating layer and the substrate, the auxiliary crack blocking layer includes metal.

16. The display device of claim 15, wherein the auxiliary crack blocking layer is disposed directly on the surface of the substrate.

* * * * *